United States Patent
Mitani et al.

(10) Patent No.: US 11,056,518 B2
(45) Date of Patent: Jul. 6, 2021

(54) IMAGING APPARATUS AND IMAGING METHOD

(71) Applicant: SONY CORPORATION, Tokyo (JP)

(72) Inventors: Hitoshi Mitani, Kanagawa (JP); Masafumi Wakazono, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/321,502

(22) PCT Filed: Aug. 9, 2017

(86) PCT No.: PCT/JP2017/028913
§ 371 (c)(1),
(2) Date: Jan. 29, 2019

(87) PCT Pub. No.: WO2018/034209
PCT Pub. Date: Feb. 22, 2018

(65) Prior Publication Data
US 2020/0185436 A1     Jun. 11, 2020

(30) Foreign Application Priority Data
Aug. 18, 2016 (JP) .............................. JP2016-160548

(51) Int. Cl.
*H04N 5/355* (2011.01)
*H04N 5/225* (2006.01)
(Continued)

(52) U.S. Cl.
CPC .......... *H01L 27/14605* (2013.01); *G02B 5/30* (2013.01); *H01L 27/14645* (2013.01); *H04N 5/23238* (2013.01); *H04N 5/2254* (2013.01)

(58) Field of Classification Search
CPC ..... H04N 5/2254; H04N 5/33563; G02B 5/30
(Continued)

(56) References Cited

U.S. PATENT DOCUMENTS 6,741,356 B1 * 5/2004 Ishiwata .................. G01B 9/04
356/491
6,864,916 B1 * 3/2005 Nayar .................. H04N 5/2355
348/224.1
(Continued)

FOREIGN PATENT DOCUMENTS

CN     102402106 A    4/2012
CN     102472958 A    5/2012
(Continued)

OTHER PUBLICATIONS

International Search Report and Written Opinion of PCT Application No. PCT/JP2017/028913, dated Nov. 7, 2017, 08 pages of ISRWO.

(Continued)

*Primary Examiner* — Anthony J Daniels
(74) *Attorney, Agent, or Firm* — Chip Law Group

(57) ABSTRACT

There is provided an imaging section that allows multiple pixels generating a pixel signal based on incident light to act as polarization pixels each having one of multiple polarizing directions. A polarization element is attached on the side of the incidence plane side of the imaging section, causes linearly polarized light to enter the imaging section. A control section, for example, controls a sensitivity detecting section to detect a sensitivity level in each of the polarizing directions of the polarization pixels in the imaging section. An image signal processing section performs gain adjustment on the polarization pixels on the basis of the sensitivity level detected in each of the polarizing directions by the sensitivity detecting section, and carries out image composition using the gain-adjusted image signals to generate a captured image having wide dynamic range with minimum motion blur.

13 Claims, 19 Drawing Sheets

(51) Int. Cl.
  *H01L 27/146* (2006.01)
  *G02B 5/30* (2006.01)
  *H04N 5/232* (2006.01)

(58) Field of Classification Search
  USPC .......................................... 348/335
  See application file for complete search history.

(56) References Cited

U.S. PATENT DOCUMENTS

| | | | | |
|---|---|---|---|---|
| 8,345,144 | B1* | 1/2013 | Georgiev | G03B 11/00 348/335 |
| 9,294,680 | B1* | 3/2016 | Pavelle | G02B 27/286 |
| 10,048,413 | B2* | 8/2018 | Shishkin | G02B 5/20 |
| 2008/0219591 | A1* | 9/2008 | Sugihara | G06T 5/50 382/284 |
| 2009/0179143 | A1* | 7/2009 | Murooka | G02B 27/281 250/225 |
| 2011/0267483 | A1* | 11/2011 | Kanamori | G06T 1/00 348/220.1 |
| 2012/0112037 | A1 | 5/2012 | Hiramoto et al. | |
| 2012/0257077 | A1* | 10/2012 | Suzuki | H04N 5/2355 348/222.1 |
| 2012/0319222 | A1 | 12/2012 | Ozawa et al. | |
| 2015/0192758 | A1* | 7/2015 | Yamagata | G02B 13/0015 348/360 |
| 2015/0381871 | A1* | 12/2015 | Makino | G02B 5/3025 348/335 |
| 2016/0094771 | A1* | 3/2016 | Kasahara | G06T 5/008 348/239 |
| 2017/0248796 | A1* | 8/2017 | Banks | G02F 1/0136 |
| 2018/0095206 | A1* | 4/2018 | Hirata | H04N 5/2254 |
| 2020/0092448 | A1* | 3/2020 | Samson | H04N 5/23232 |

FOREIGN PATENT DOCUMENTS

| | | | |
|---|---|---|---|
| EP | 2615640 A1 | 7/2013 | |
| JP | 2011-237646 A | 11/2011 | |
| JP | 2011-244309 A | 12/2011 | |
| JP | 2012-080065 A | 4/2012 | |
| KR | 10-2013-0101972 A | 9/2013 | |
| TW | 201222008 A | 6/2012 | |
| WO | 2011/142063 A1 | 11/2011 | |
| WO | 2012/032939 A1 | 3/2012 | |
| WO | WO-2012039087 A1 * | 3/2012 | ........... H04N 5/2254 |
| WO | WO-2017090229 A1 * | 6/2017 | ........... H04N 5/2254 |

OTHER PUBLICATIONS

Office Action for JP Patent Application No. 2018-534370, dated Nov. 27, 2018.

* cited by examiner

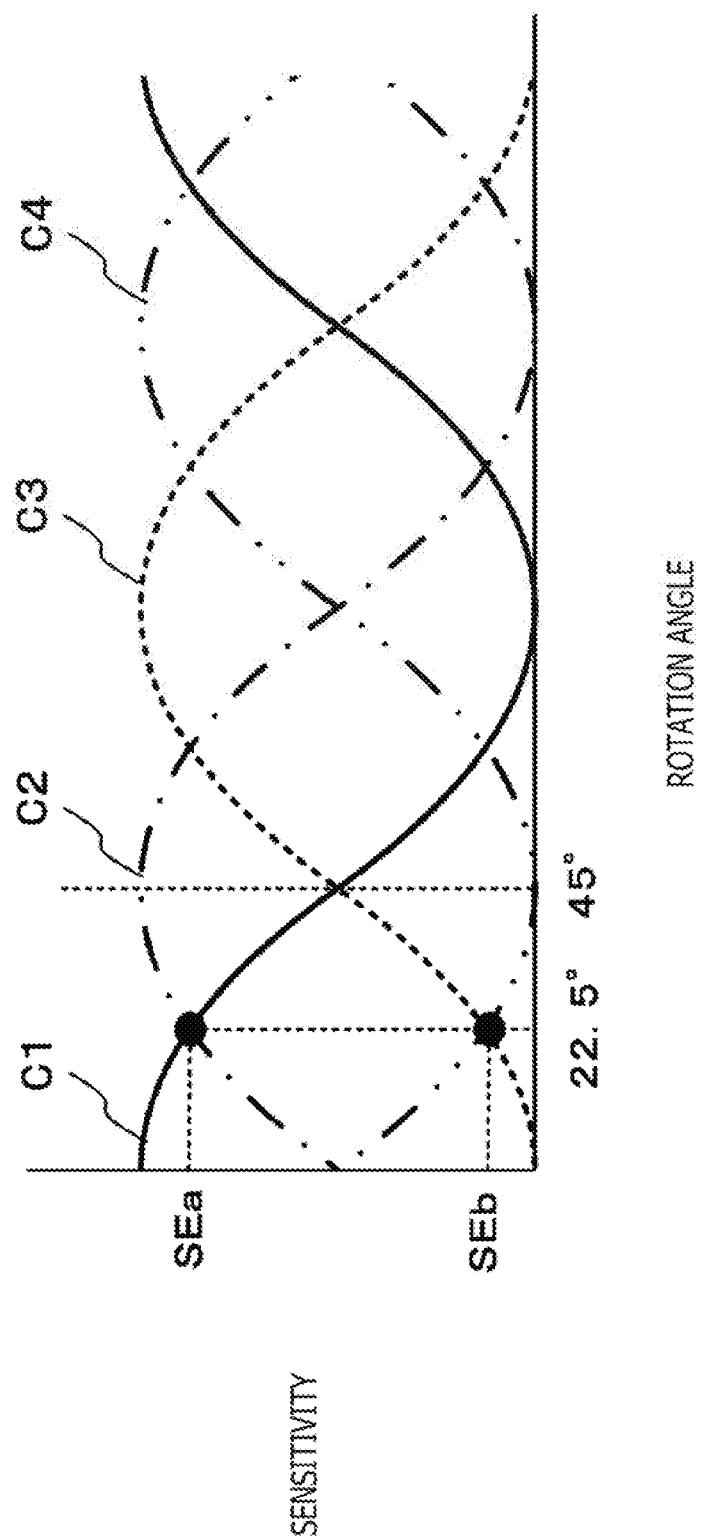

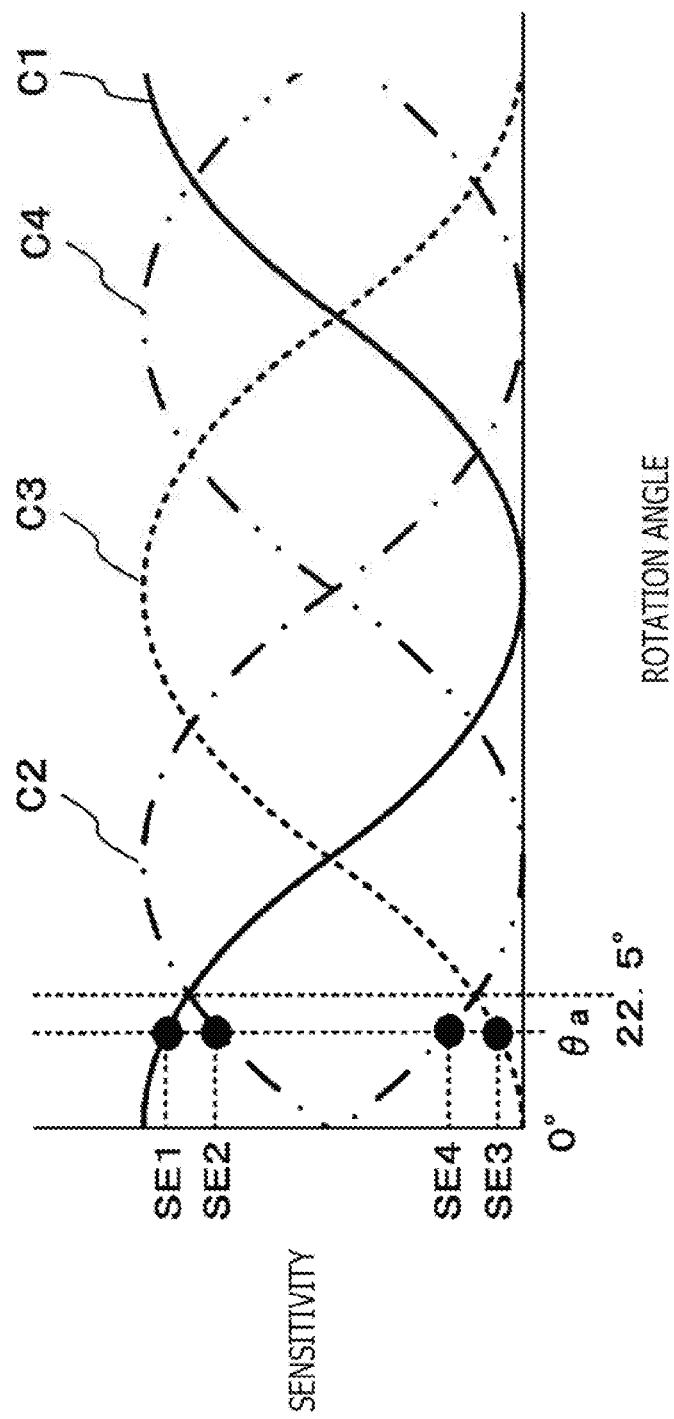

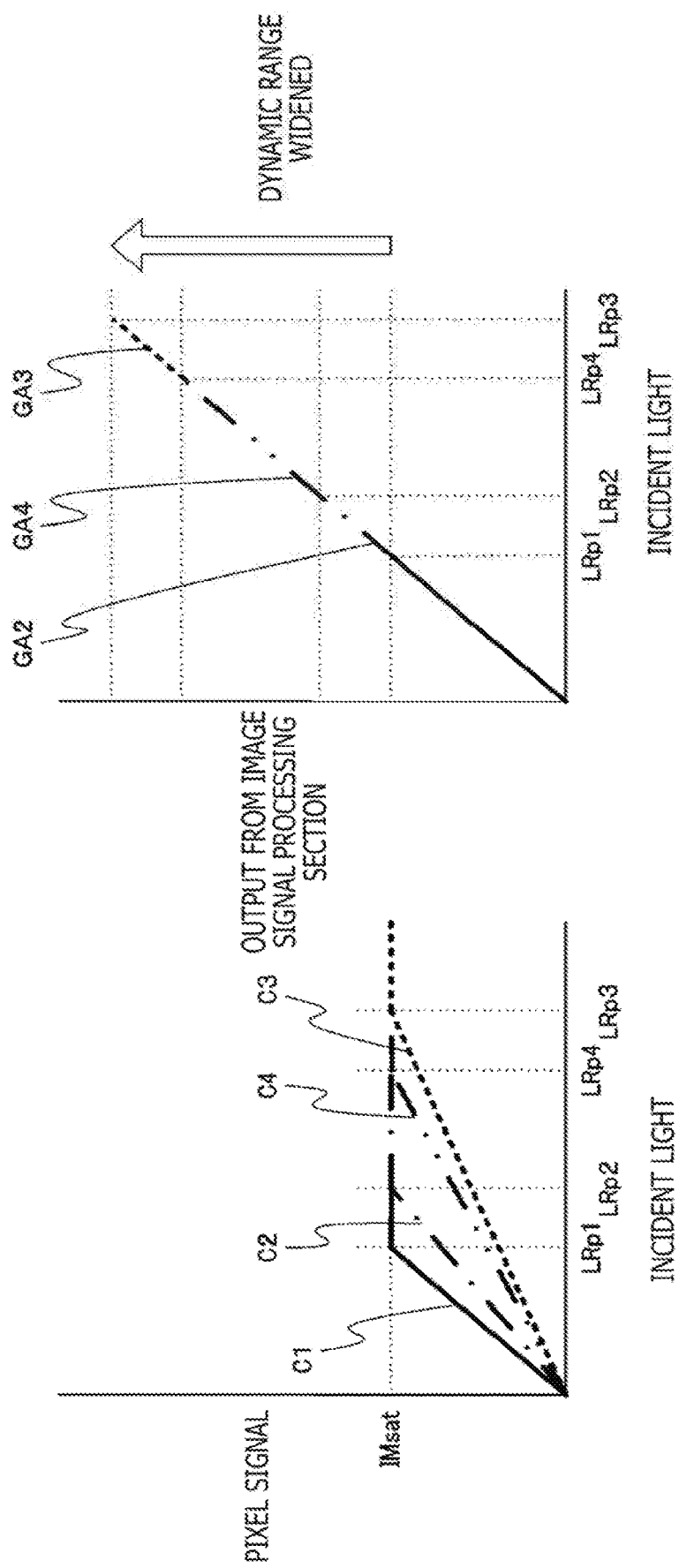

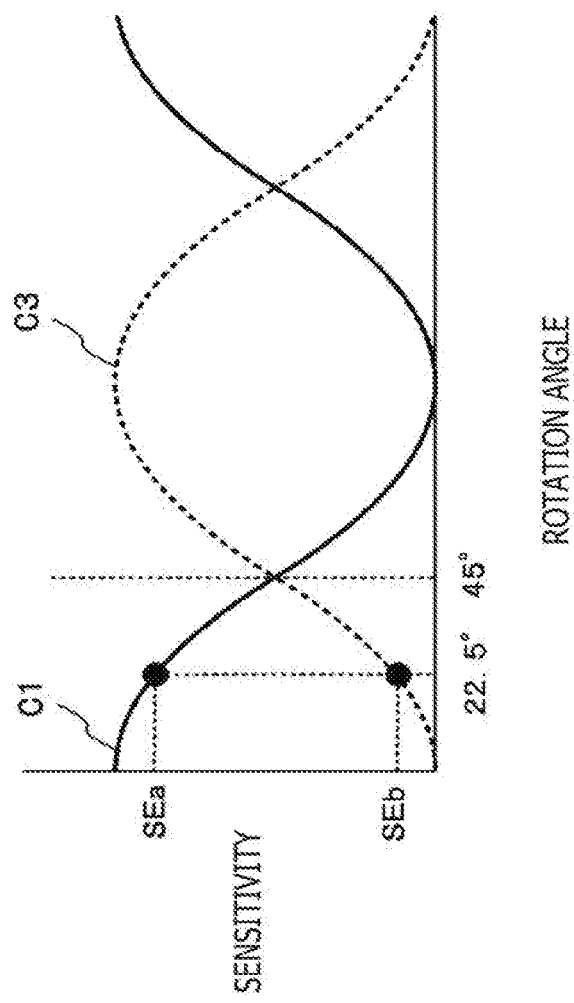

IMAGING APPARATUS AND IMAGING METHOD

CROSS REFERENCE TO RELATED APPLICATIONS

This application is a U.S. National Phase of International Patent Application No. PCT/JP2017/028913 filed on Aug. 9, 2017, which claims priority benefit of Japanese Patent Application No. JP 2016-160548 filed in the Japan Patent Office on Aug. 18, 2016. Each of the above-referenced applications is hereby incorporated herein by reference in its entirety.

TECHNICAL FIELD

The present technology relates to an imaging apparatus and an imaging method for capturing images having dynamic range with minimum motion blur.

BACKGROUND ART

Imaging apparatuses use solid-state imaging devices such as CMOS (Complementary Metal Oxide Semiconductor) image sensors or CCD (Charge Coupled Device) image sensors. These types of solid-state imaging devices perform photoelectric conversion to accumulate electric charges reflecting the amount of incident light in order to output an electric signal representing the accumulated charges. However, the amount of charges that can be accumulated by photoelectric conversion element has an upper limit. Given an amount of light exceeding a certain level, the amount of accumulated charges reaches a saturation level. A target object region subjected to a luminance level higher than the certain level is brought to the saturation level in a phenomenon known as overexposure and appears overly bright. Under these circumstances, PLT 1 proposes techniques for generating a wide dynamic range image by compositing multiple images with different exposure times.

CITATION LIST

Patent Literature

[PTL 1] Japanese Patent Laid-Open No. 2011-244309

SUMMARY

Technical Problem

Meanwhile, when the target object or the imaging apparatus moves, motion blur becomes prominent in a captured image over a long exposure time. That means the motion blur is more likely to occur in a wide dynamic range image obtained by compositing multiple images with different exposure times.

Thus an object of the present technology is to provide an imaging apparatus and an imaging method for capturing images having wide dynamic range with minimum motion blur, the imaging apparatus and the imaging method being devised to vary the dynamic range of the captured images at the same time, the imaging apparatus and the imaging method being further devised to perform polarization imaging in a case where there is no need to widen the dynamic range.

Solution to Problem

According to a first aspect of the present technology, there is provided an imaging apparatus including:

an imaging section configured to let multiple pixels generating a pixel signal based on incident light act as polarization pixels each having one of multiple polarizing directions; and a polarization element configured to be attached on the side of an incidence plane of the imaging section.

According to the present technology, multiple pixels of the imaging section for generating a pixel signal based on incident light are used as polarization pixels each having one of multiple polarizing directions. The polarization element is attached detachably or rotatably on the side of the incidence plane side of the imaging section. The attachment angle of the polarization element with respect to the imaging section is set in such a manner that the polarization element generates linearly polarized light and produces a difference in sensitivity between the polarization pixels having the polarizing directions different from each other in the imaging section.

Also, the imaging apparatus includes a sensitivity detecting section and an image signal processing section. The sensitivity detecting section detects a sensitivity level of the polarization pixels in each of the polarizing directions in the imaging section. For example, the sensitivity detecting section detects the sensitivity level in each polarizing direction based on the attachment angle of the polarization element or on the basis of pixel signals generated by the polarization pixels having the polarizing directions different from each other. In a case where the polarization element is attached, the image signal processing section generates the image signal of a captured image at each sensitivity level using the polarization pixels having, for example, the same sensitivity level on the basis of the sensitivity levels detected by the sensitivity detecting section. The image signal processing section thus performs gain adjustment on the image signal of the captured image at each sensitivity level on the basis of the sensitivity levels detected by the sensitivity detecting section. Using the gain-adjusted image signals, the image signal processing section carries out image composition of the captured image at each sensitivity level. In a case where some of the polarization pixels are saturated during the image composition, the image signal processing section performs switchover from the image signal of the captured image generated by use of the saturated polarization pixels to the image signal of the captured image generated by use of the polarization pixels having a sensitivity level lower than that of the saturated polarization pixels. For example, the image signal processing section controls, in response to the incident light, a composition ratio between the image signal of the captured image generated by use of the saturated polarization pixels and the image signal of the captured image generated by use of the polarization pixels having the lower sensitivity level, thereby performs switchover from the mage signal of the captured image generated by use of the saturated polarization pixels to the image signal of the captured image generated by use of the polarization pixels having the lower sensitivity level.

According to a second aspect of the present technology, there is provided an imaging method characterized in that, given an imaging section configured to let multiple pixels generating a pixel signal based on incident light act as polarization pixels each having one of multiple polarizing directions, a sensitivity detecting section is caused to detect a sensitivity level of the polarization pixels in each of the polarizing directions when the incident light enters the imaging section via a polarization element; and gain adjustment is performed on the polarization pixels on the basis of the sensitivity levels detected by the sensitivity detecting section, and the gain-adjusted pixel signals are used by an image signal processing section to perform image composition.

Effect of the Invention

According to the present technology, incident light via a polarization element enters an imaging section furnished with polarization pixels each having one of multiple polarizing directions. The polarization pixels are thus given sensitivity levels reflecting the polarizing direction of the incident light, permitting imaging with wide dynamic range. Gain adjustment is performed on the basis of the sensitivity levels of the polarization pixels, and image composition is carried out using the gain adjusted image signals to generate a captured image having wide dynamic range with minimum motion blur. Incidentally, the advantageous effects stated in this description are only examples and are not limitative of the present technology. There may be additional advantageous effects derived from this description.

BRIEF DESCRIPTION OF DRAWINGS

FIG. 8 is a schematic diagram depicting a case where, for example, the rotation angle (θ) of the polarization element is 22.5 degrees.

FIG. 14 is a schematic diagram depicting a case where the rotation angle of the polarization element is larger than 0 degrees and smaller than 22.5 degrees.

FIGS. 15A and 15B are another set of schematic diagrams explaining gain adjustment and image composition.

FIGS. 17A and 17B are set of schematic diagrams depicting a case where polarization pixels have two polarizing directions.

DESCRIPTION OF EMBODIMENTS

The preferred embodiments for implementing the present technology are described below. The description is given under the following headings:
1. Configuration of the imaging apparatus
2. Operations of the imaging apparatus
2-1. First imaging operation in wide dynamic range imaging mode
2-2. Second imaging operation in wide dynamic range imaging mode
3. Other configurations of the imaging apparatus
4. Application examples

1. CONFIGURATION OF THE IMAGING APPARATUS

Figure 1:
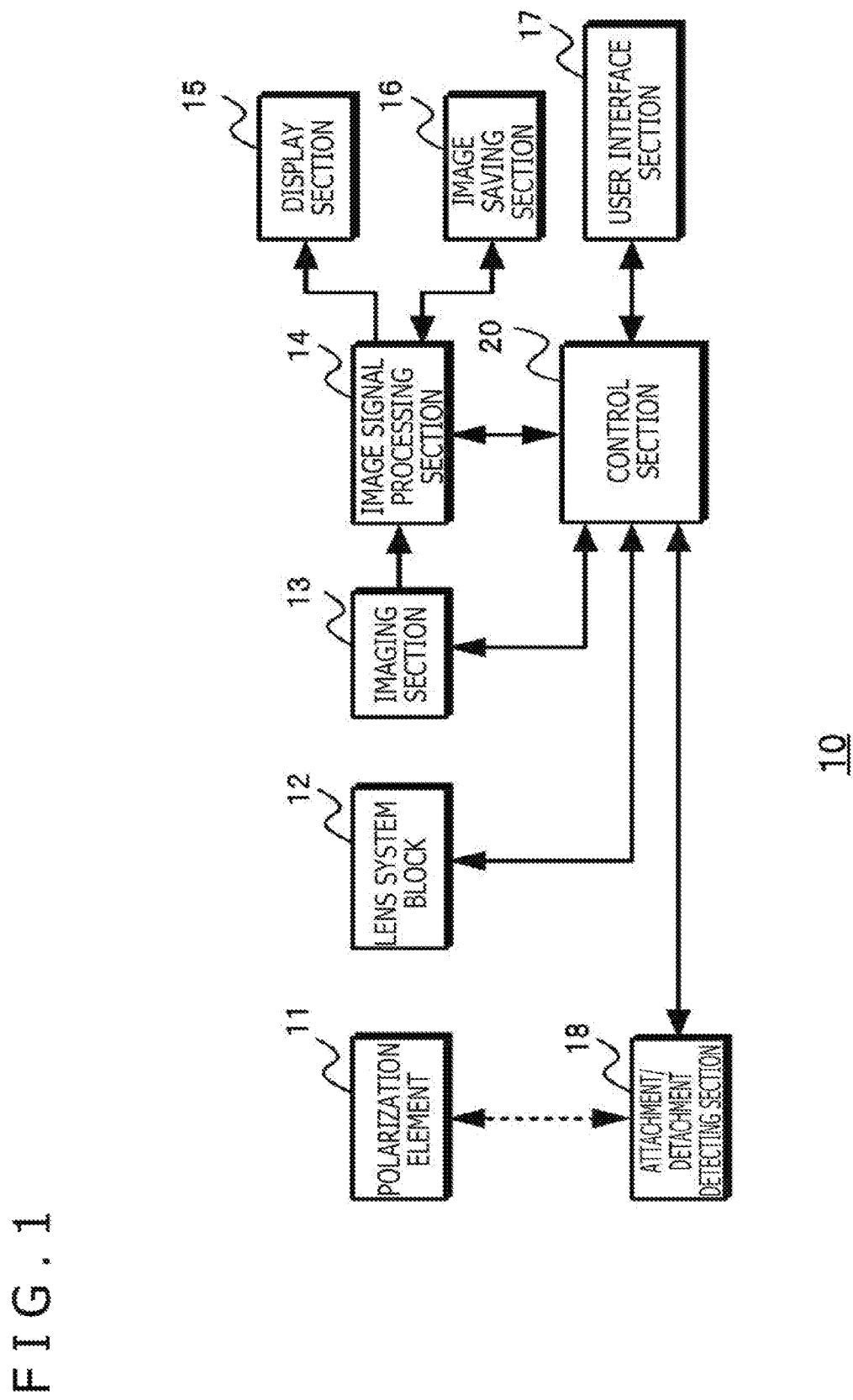
FIG. 1 is a schematic diagram depicting a typical configuration of an imaging apparatus.

FIG. 1 depicts a typical configuration of an imaging apparatus. The imaging apparatus 10 includes a polarization element 11, a lens system block 12, an imaging section 13, an image signal processing section 14, a display section 15, an image saving section 16, a user interface section 17, an attachment/detachment detecting section 18, and a control section 20.

The polarization element 11 is a linear polarization element, such as a polarization filter formed by a wire grid, which generates linearly polarized light. The polarization element 11 may be configured to be rotatable around the optical axis direction of light that is incident on the imaging section 13 so that the polarizing direction of the linearly polarized light may be changed.

The lens system block 12 includes a focus lens, a zoom lens, and a diaphragm mechanism. The lens system block 12 also has a driving section that drives the lenses and the diaphragm mechanism under instructions from the control section 20. In accordance with instructions from the control section 20, the lens system block 12 controls the positions of the focus lens and zoom lens to form an optical image of the target object on an exposure plane of the imaging section 13. The lens system block 12 adjusts the light intensity of object light by controlling the aperture opening under instructions from the control section 20. The positions of the focus lens, zoom lens, and diaphragm mechanism may be mechanically moved in response to a user's operations.

The imaging section 13 is configured using a CMOS (Complementary Metal Oxide Semiconductor) image sensor or a CCD (Charge Coupled Device) image sensor, for example.

Figure 2:
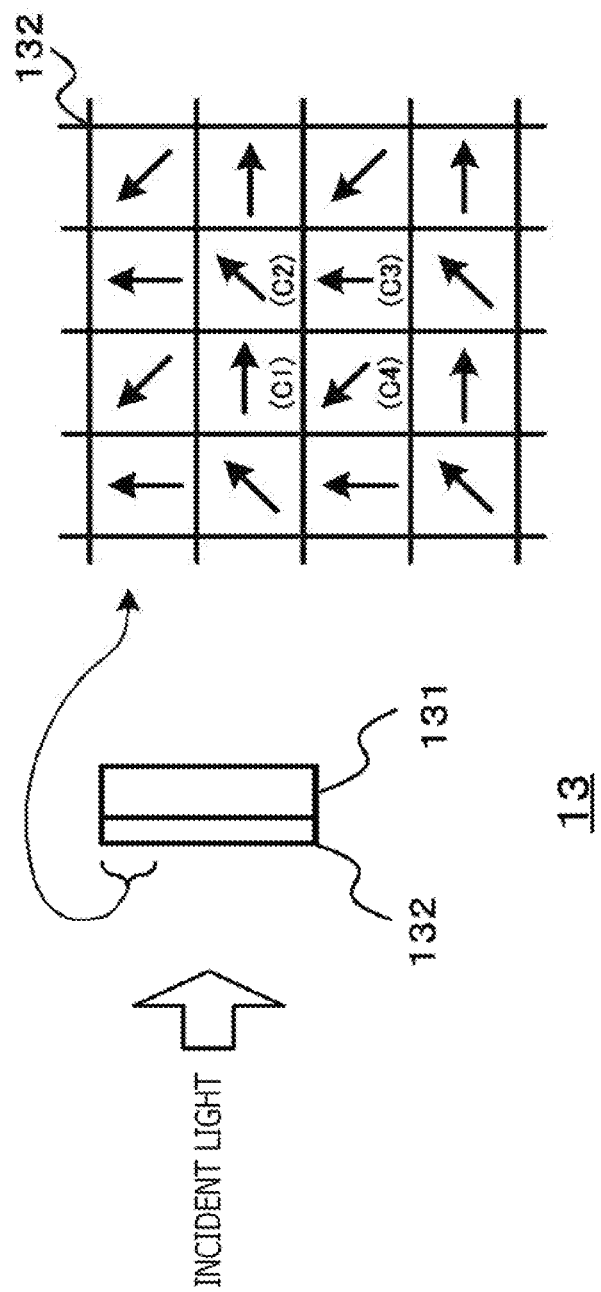
FIG. 2 is a schematic diagram depicting a typical configuration of an imaging section.

The imaging section 13 is further configured to have a polarization filter with pixels having multiple polarizing directions on an incidence plane of the image sensor. In the polarization filter, multiple pixels for generating pixel signals based on incident light are configured to be polarization pixels each having one of multiple polarizing directions. FIG. 2 depicts a typical configuration of the imaging section. The imaging section 13 has a polarization filter 132 disposed on the incidence plane of an image sensor 131. In the case where normal line information is acquired from a polarized image as disclosed in Japanese Patent Laid-Open No. 2015-114307, a polarization filter with pixels having at least three polarizing directions is used. FIG. 2 depicts an example in which the incidence plane of the image sensor 131 is furnished with the polarization filter 132 with pixels each having one of four different polarizing directions, such as 0, 45, 90, and 135 degrees (the polarizing directions are indicated by arrows). The imaging section 13 outputs an image signal of a generated polarized image to the image signal processing section 14. It is assumed here that a pixel having a polarizing direction of 0 degrees is referred to as a polarization pixel C1, a pixel having a polarizing direction of 45 degrees as a polarization pixel C2, a pixel having a polarizing direction of 90 degrees as a polarization pixel C3, and a pixel having a polarizing direction of 135 degrees as a polarization pixel C4.

The image signal processing section 14 performs various kinds of image processing such as a noise reduction process, a gain adjustment process, a faulty pixel correction process, a demosaicing process, a color calibration process, and a resolution conversion process on the image signal output from the imaging section 13. In the case where the polarization element 11 is attached, the image signal processing section 14 performs gain adjustment on the polarization pixels of the imaging section 13 in accordance with their sensitivity levels, and carries out image composition using the gain-adjusted image signals. The sensitivity of the polarization pixels in the imaging section 13 applies when object light is incident on the imaging section via the polarization element 11. The sensitivity thus varies depending on the relations between the polarizing direction of the polarization element 11 and the polarizing direction of the polarization pixels in the imaging section 13. The image signal processing section 14 outputs the processed image signal to the display section 15 and to the image saving section 16. Under control of the control section 20, the image signal processing section 14 superposes on the image signal a display signal for displaying menus used to set the imaging apparatus 10 and to verify the set state as well as information regarding the set state at the time of imaging, before outputting the image signal to the display section 15, for example. Also, in a case where the image signal processing section 14 acts as a sensitivity detecting section, the image signal processing section 14 detects the sensitivity of the polarization pixels in each polarizing direction in the imaging section on the basis of the image signal supplied from the imaging section 13. For example, the image signal processing section 14 detects the sensitivity from the signal intensity level in each polarizing direction applicable when a target object with brightness not causing pixel saturation is imaged.

The display section 15 is configured with a liquid crystal display or an organic EL (EL: Electro luminescence) display, for example. The display section 15 has captured images and diverse information displayed on its screen. For example, the display section 15 displays on the screen a through-image based on image data output from the image signal processing section 14. Also, when the image signal processing section 14 reproduces an image recorded in the image saving section 16, the display section 15 displays the reproduced image on the screen. Further, the display section 15 permits menu display and information display.

The image saving section 16 stores the image data output from the image signal processing section 14 and metadata regarding the image data (e.g., dates and times at which the image data was acquired). The image saving section 16 is configured with a semiconductor memory, an optical disc, or a HD (hard Disc), for example. The image saving section 16 may be fixedly attached inside the imaging apparatus 10 or detachably attached to the imaging apparatus 10.

The user interface section 17 includes a shutter button, operation switches, and a touch panel. The user interface section 17 generates operation signals corresponding to operations performed by the user on the shutter button, various operation switches, or touch panel, and outputs the generated signals to the control section 20.

In the case where the polarization element 11 is detachably attachable to the imaging apparatus 10, the attachment/detachment detecting section 18 detects whether the polarization element 11 is attached to or detached from the imaging apparatus 10. The attachment/detachment detecting section 18, which is formed by switches and sensors, outputs to the control section 20 a detection signal indicating whether the polarization element 11 is attached to or detached from the imaging apparatus 10.

The control section 20 includes a CPU (Central Processing Unit), a ROM (Read Only Memory), and a RAM (Random Access Memory). The ROM (Read Only Memory) stores various programs to be executed by the CPU (Central Processing Unit). The RAM (Random Access Memory) stores information such as various parameters. The CPU executes the various programs stored in the ROM and, on the basis of the operation signals from the user interface section 17, controls the components involved in such a manner that the imaging apparatus 10 performs an imaging operation in an operation mode corresponding to the user's operations.

Also, in the case where the control section 20 discriminates that the polarization element 11 is attached to the imaging apparatus 10 on the basis of the detection signal from the attachment/detachment detecting section 18, the control section 20 determines that the imaging mode is wide dynamic range imaging mode. In the case where the control section 20 acts as a sensitivity detecting section and sets wide dynamic range imaging mode as the imaging mode, the control section 20 detects the sensitivity level in each polarizing direction of the polarization pixels in the imaging section on the basis of the attachment angle of the polarization element, for example. The control section 20 notifies the image signal processing section 14 of the detected sensitivity levels. This allows the image signal processing section 14 to perform gain adjustment and image composition as mentioned above, so as to generate the image signal of a captured image with wide dynamic range. Also, in the case where the polarization element 11 is detected to be detached from the imaging apparatus 10 on the basis of the detection signal from the attachment/detachment detecting section 18, the control section 20 determines that the imaging mode is polarization imaging mode. Upon determining that polarization imaging mode is in effect, the control section 20 controls the image signal processing section 14 to generate the image signal of the captured image without performing gain adjustment corresponding to sensitivity ratio or carrying out a pixel signal compositing process following the gain adjustment.

2. OPERATIONS OF THE IMAGING APPARATUS

Figure 3:
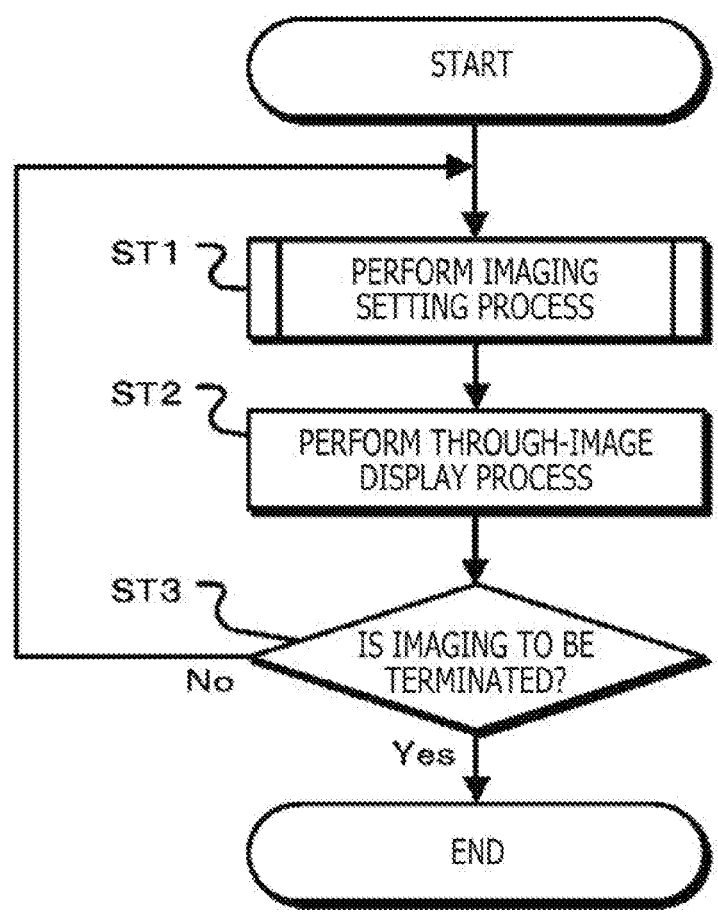
FIG. 3 is a flowchart depicting operations of the imaging apparatus.
Figure 4:
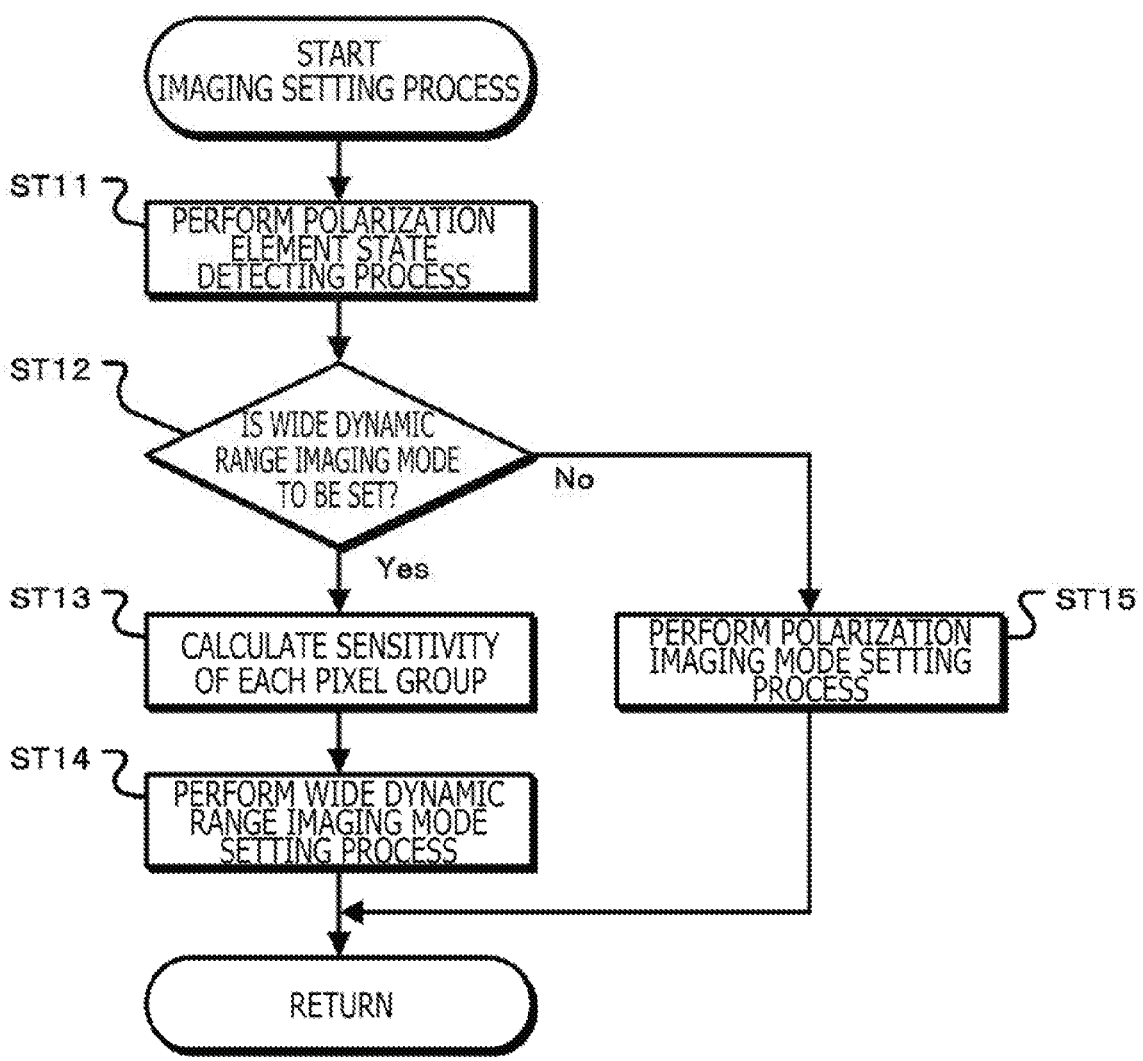
FIG. 4 is a flowchart depicting an imaging setting process.

The operations of the imaging apparatus are explained below. FIG. 3 is a flowchart depicting the operations of the imaging apparatus. In step ST1, the control section performs an imaging setting process. FIG. 4 is a flowchart illustrating the imaging setting process.

In step ST11, the control section performs a polarization element state detecting process. The control section 20 detects an attached/detached state of the polarization element 11 on the basis of the detection signal from the attachment/detachment detecting section 18, before going to step ST12.

In step ST12, the control section discriminates whether to set wide dynamic range imaging mode as the imaging mode. In the case where the control section 20 detects in step ST11 that the polarization element 11 is attached, the control section 20 sets wide dynamic range imaging mode as the imaging mode, before going to step ST13. In the case where the control section 20 detects that the polarization element 11 is detached, the control section 20 sets polarization imaging mode as the imaging mode, before going to step ST15.

In step ST13, the control section calculates the sensitivity level of each group of pixels. The control section 20 detects the sensitivity level of each group of pixels having the same polarizing direction in the polarized image in the imaging section 13, before going to step ST14.

In step ST14, the control section performs a wide dynamic range imaging mode setting process. The control section 20 sets exposure time and other settings on the imaging section 13 in accordance with the luminance level of the target object. Also, the control section 20 sets the operations of the image signal processing section 14 in such a manner that the image signal processing section 14 performs gain adjustment using the sensitivity levels calculated in step ST13 and carries out image composition using the gain-adjusted image signals in order to generate a wide dynamic range image. At the same time, the control section 20 causes the image signal processing section 14 to execute diverse image processing such as noise reduction process, faulty pixel correction process, demosaicing process, color calibration process, and resolution conversion process, before going to step ST2 in FIG. 3.

After going from ST12 to step ST15, the control section performs a polarization imaging mode setting process. The control section 20 sets exposure time and other settings in accordance with the luminance level of the target object. At the same time, the control section 20 causes the image signal processing section 14 to execute diverse image processing such as noise reduction process, faulty pixel correction process, demosaicing process, color calibration process, and resolution conversion process, before going to step ST2 in FIG. 3.

In step ST2, the control section performs a through-image display process. The control section 20 controls the imaging section 13 in accordance with the imaging settings made in step ST1, causing the imaging section 13 to generate an image signal that in turn causes the display section 15 to display a through-image, before going to step ST3.

In step ST3, the control section discriminates whether imaging is to be terminated. In the case where the operation mode of the imaging apparatus is not switched from the mode in which the target object is imaged and a recording image is saved to some other operation mode, or where an exit operation to terminate the operation of the imaging apparatus is not carried out, the control section 20 determines that imaging is not to be terminated and returns to step ST1. In the case where operations are performed to switch to some other operation or where the exit operation is carried out, the control section 20 terminates the operation.

Figure 5:
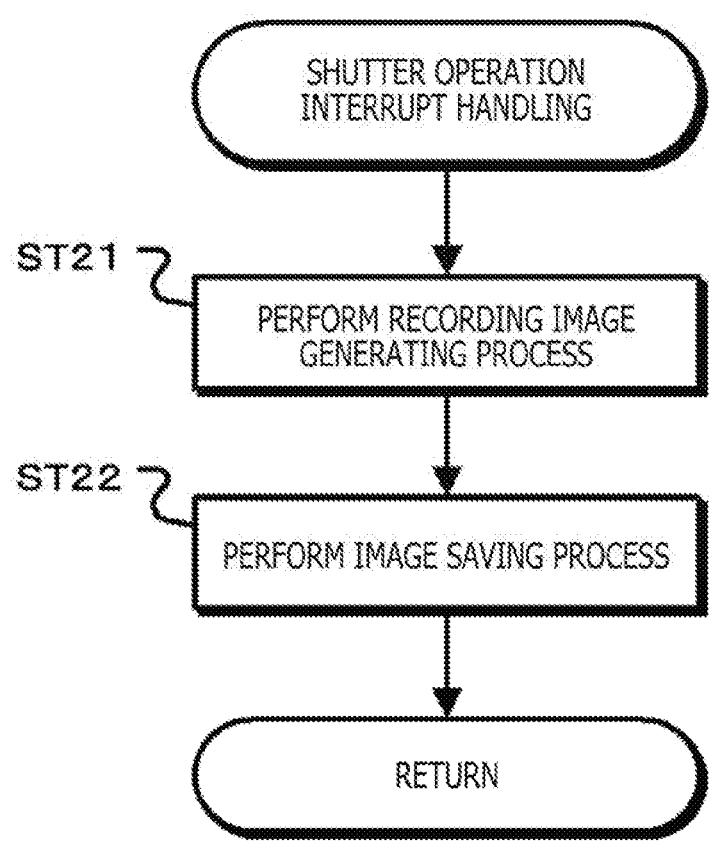
FIG. 5 is a flowchart depicting interrupt handling process.

In the case where a shutter operation is performed during the transition from step ST1 to step ST3 in FIG. 3, the control section carries out interrupt handling process depicted in FIG. 5. In step ST21, the control section performs a recording image generating process. In the case where the imaging mode is wide dynamic range imaging mode, the control section 20 operates the imaging section 13 and the image signal processing section 14 in accordance with the imaging settings for the wide dynamic range imaging mode setting process, thereby generating the image signal of a wide dynamic range image. Also, in the case where the imaging mode is polarization imaging mode, the control section 20 drives the imaging section 13 using the imaging settings for the polarization imaging mode setting process so as to generate the image signal of a polarized image. The control section 20 generates the image signal of the wide dynamic range image or of the polarized image, before going to step ST22. The imaging operations in wide dynamic range imaging mode will be discussed later.

In step ST22, the control section performs an image saving process. The control section 20 outputs the image signal generated in step ST21 to the image signal processing section 14 for diverse processing. The control section 20 then saves the processed image signal into the image saving section 16, before terminating the interrupt handling process.

<2-1. First Imaging Operation in Wide Dynamic Range Imaging Mode>

A first imaging operation performed by the imaging apparatus in wide dynamic range imaging mode is explained below. In the case where the polarization element is attached to the imaging apparatus, the imaging apparatus determines that wide dynamic range imaging mode is in effect and generates the image signal of a wide dynamic range image.

Figure 6A:
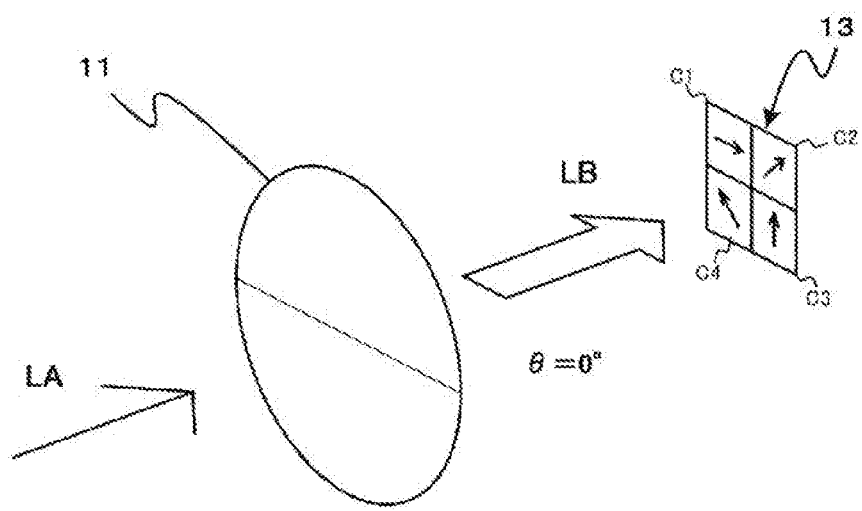
FIGS. 6A, 6B, and 6C are set of schematic diagrams depicting relations among incident light, linearly polarized light having passed through a polarization element, and the imaging section.
Figure 6B:
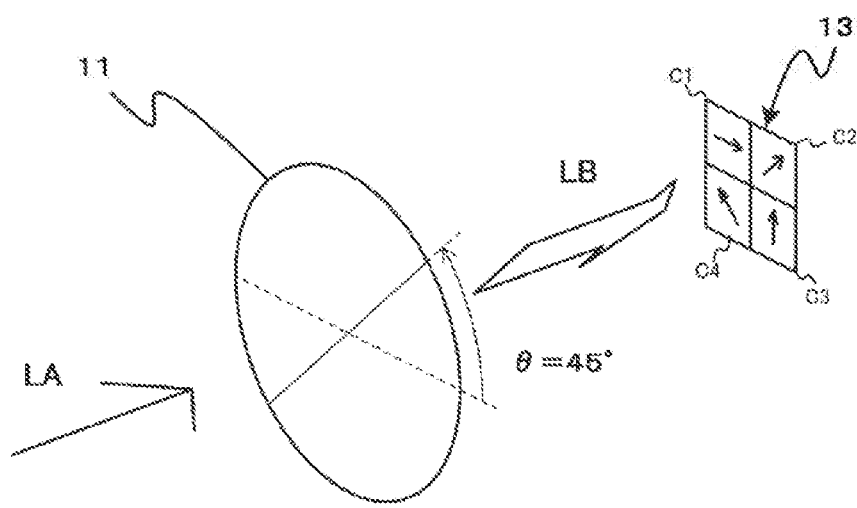
Figure 6C:
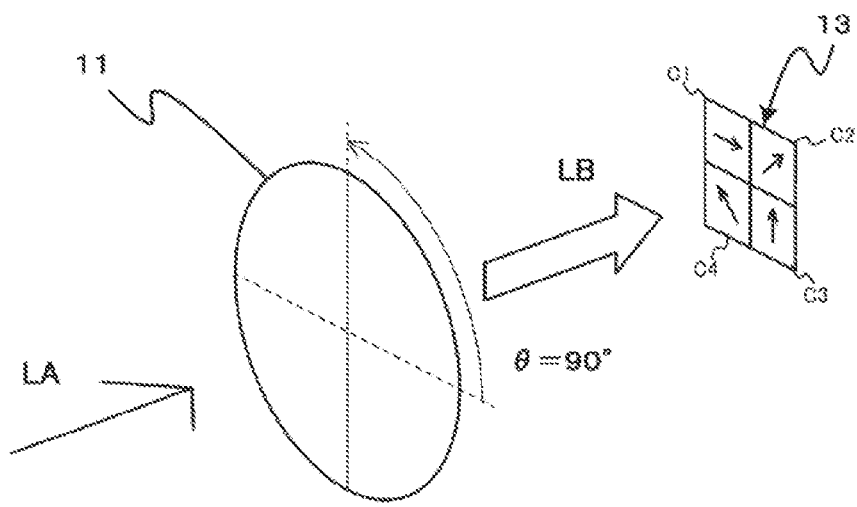

FIGS. 6A, 6B, and 6C depict relations among incident light, linearly polarized light having passed through the polarization element, and the imaging section. When incident light LA enters the polarization element 11, linearly polarized light LB passes through the polarization element 11 to enter the imaging section 13. When the polarization element 11 is rotated around the optical axis direction of light that is incident on the imaging section 13, the polarizing direction of the linearly polarized light LB is changed. In the case where the rotation angle θ of the polarization element 11 (or the attachment angle applicable when the polarization element is attached to the imaging section) is 0 degrees as depicted in Subfigure FIG. 6A, the polarizing direction of the linearly polarized light LB becomes the same as that of the polarization pixels C1 in the imaging section 13. In the case where the rotation angle θ of the polarization element 11 is 45 degrees as depicted in Subfigure FIG. 6B, the polarizing direction of the linearly polarized light LB becomes the same as that of the polarization pixels C2 in the imaging section 13. In the case where the rotation angle θ of the polarization element 11 is 90 degrees as depicted in Subfigure (c) in FIG. 6C, the polarizing direction of the linearly polarized light LB becomes the same as that of the polarization pixels C3 in the imaging section 13. In the case where the rotation angle θ of the polarization element 11 is 135 degrees, not illustrated in FIGS. 6A, 6B, and 6C, the polarizing direction of the linearly polarized light LB becomes the same as that of the polarization pixels C3 in the imaging section 13.

Figure 7:
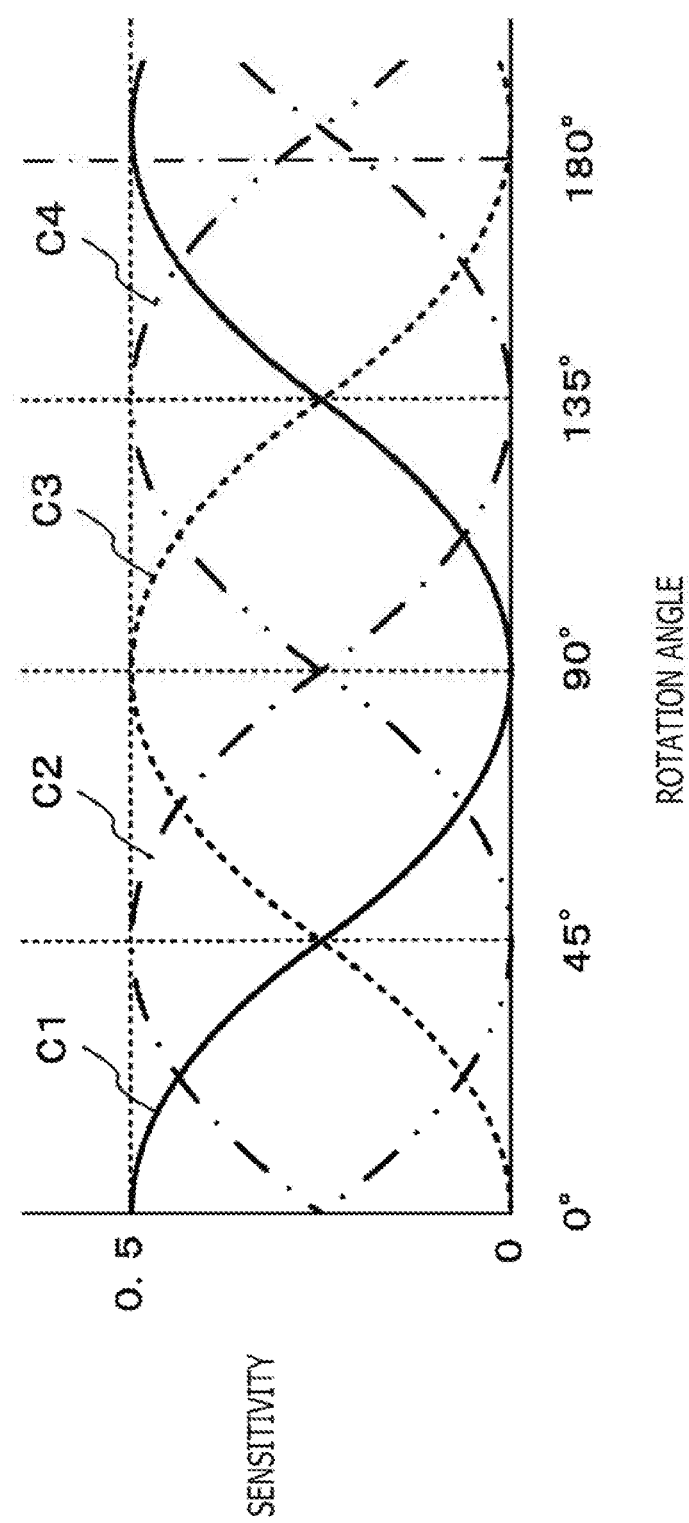
FIG. 7 is a schematic diagram depicting typical relations between the rotation angle of the polarization element and the sensitivity level of polarization pixels in the imaging section.

FIG. 7 depicts typical relations between the rotation angles of the polarization element and the sensitivity levels of polarization pixels in the imaging section. As illustrated in FIGS. 6A, 6B, and 6C, the polarization element 11 is configured to be rotatable around the optical axis direction of light that is incident on the imaging section 13. In the case where the polarization element is rotated to have its polarizing direction changed, the sensitivity levels of the polarization pixels in the imaging section 13 are changed in accordance with the rotation angle of an imaging device.

For example, the sensitivity level of the polarization pixels C1 with their polarizing direction being 0 degrees is maximized (e.g., 0.5) in the case where the rotation angle θ of the polarization element 11 is 0 degrees. Thereafter, as the polarizing direction of the polarization element 11 is rotated, the sensitivity level of the polarization pixels C1 is lowered. The sensitivity level of the polarization pixels C1 is minimized (e.g., 0) in the case where the rotation angle θ of the polarization element 11 is 90 degrees. As the polarizing direction of the polarization element 11 is further rotated, the sensitivity level of the polarization pixels C1 is increased. The sensitivity level of the polarization pixels C1 is maximized (e.g., 0.5) in the case where the rotation angle θ of the polarization element 11 is 180 degrees.

Likewise, the sensitivity level of the polarization pixels C2 with their polarizing direction being 45 degrees is maximized (e.g., 0.5) in the case where the rotation angle θ of the polarization element 11 is 45 degrees. Thereafter, as the polarizing direction of the polarization element 11 is rotated, the sensitivity level of the polarization pixels C2 is lowered. The sensitivity level of the polarization pixels C2 is minimized (e.g., 0) in the case where the rotation angle θ of the polarization element 11 is 135 degrees. As the polarizing direction of the polarization element 11 is further rotated, the sensitivity level of the polarization pixels C2 is increased. The sensitivity level of the polarization pixels C3 with their polarizing direction being 90 degrees and the sensitivity level of the polarization pixels C4 with their polarizing direction being 135 degrees are likewise changed in accordance with the rotation angle θ of the polarization element 11.

In the case where the rotation angle θ of the polarization element 11 is, for example, 22.5 degrees as depicted in FIG. 8, the sensitivity levels of the polarization pixels C1 and C2 are high, whereas the sensitivity levels of the polarization pixels C3 and C4 are lower than those of the polarization pixels C1 and C2. That is, pixel signals of different sensitivity levels can be generated simultaneously. Thus the polarization element 11 is configured in such a manner that it can be detachably attached at an angle at which pixel signals of different sensitivity levels may be generated simultaneously. The control section 20 detects the sensitivity level of the polarized image on the basis of the result of detection by the attachment/detachment detecting section 18. For example, in the case where the polarization element 11 is detachably attachable at a rotation angle θ of 22.5 degrees, the sensitivity level of the polarization pixels C1 and C2 and that of the polarization pixels C3 and C4 at the time the rotation angle θ of the polarization element 11 is 22.5 degrees are calculated beforehand. When the polarization element 11 is detected to be attached, the calculated sensitivity levels are used to detect those of the polarization pixels.

Also, on the basis of the sensitivity ratio between high- and low-sensitivity polarization pixels, the control section 20 sets the gain of the low-sensitivity polarization pixels and outputs the setting to the image signal processing section 14. For example, in a case where the polarization pixels C1 and C2 have a sensitivity level SEa and the polarization pixels C3 and C4 have a sensitivity level SEb, the control section 20 sets the sensitivity ratio SEa/SEb as a gain GAab for the low-sensitivity pixels C3 and C4 and outputs the setting to the image signal processing section 14. The image signal processing section 14 may calculate the sensitivity levels and sensitivity ratio and set the gain accordingly. For example, the image signal processing section 14 may calculate the sensitivity level in each polarizing direction and the sensitivity ratio between high- and low-sensitivity polarization pixels based on the pixel signals of the polarization pixels at the time the target object of predetermined luminance is imaged, and may set the gain on the basis of the calculated sensitivity ratio.

Figures 9A, 9B:
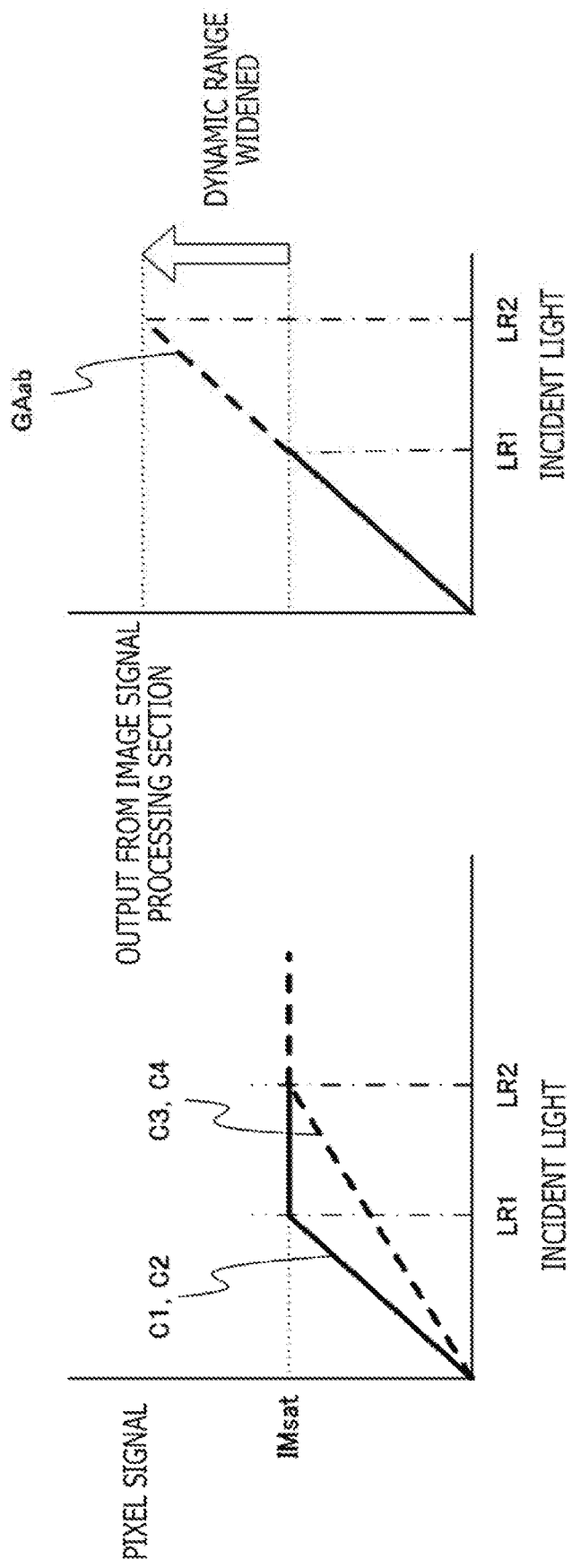
FIGS. 9A and 9B is a are set of explanatory diagrams explaining gain adjustment and image composition.

The image signal processing section 14 performs gain adjustment using the set gain and carries out image composition following the gain adjustment. FIGS. 9A and 9B are set of explanatory diagrams explaining gain adjustment and image composition. Subfigure FIG. 9A depicts typical signal intensity of the polarization pixels with respect to incident light. For example, the high-sensitivity polarization pixels C1 and C2 are saturated at a signal intensity level IMsat in the case where incident light has a luminance level LR1. The low-sensitivity polarization pixels C3 and C4 are saturated at the signal intensity level IMsat in the case where incident light has a luminance level LR2 higher than the luminance level LR1. In the case where the polarization pixel C1 and C2 are saturated, the image signal processing section 14 performs image composition by amplifying the pixel signals of the polarization pixels C3 and C4 using the gain GAab reflecting the sensitivity level, as depicted in Subfigure FIG. 9B. This makes it possible to generate a wide dynamic range image signal in which saturation does not occur even if the incident light has luminance higher than the luminance level LR1. Whether or not the incident light has luminance higher than the luminance level LR1 is discriminated on the basis of the signal level of the image signal from the imaging section 13.

Figure 10:
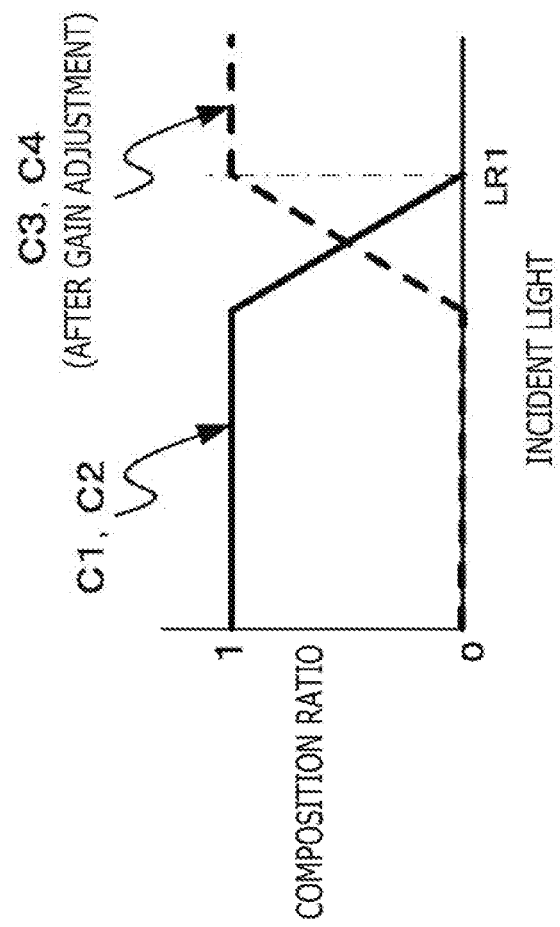
FIG. 10 is a schematic diagram depicting typical relations between incident light and composition ratio.

Further, during the image composition, the image signal processing section 14 may set composition ratio with respect to incident light (i.e., signal level of the image signal from the imaging section 13) in such a manner that a switchover from the image based on the polarization pixels C1 and C2 to the image following the gain adjustment of the polarization pixels C3 and C4 is inconspicuous. FIG. 10 depicts typical relations between incident light and composition ratio. The image signal processing section 14 adjusts composition ratio before the luminance level LR1 is reached at which the polarization pixels C1 and C2 are saturated. When the luminance level LR1 is reached at which saturation occurs, the image signal processing section 14 sets composition ratio in such a manner that the switchover from the image based on the polarization pixels C1 and C2 to the image following the gain adjustment of the polarization pixels C3 and C4 is completed.

Figure 11:
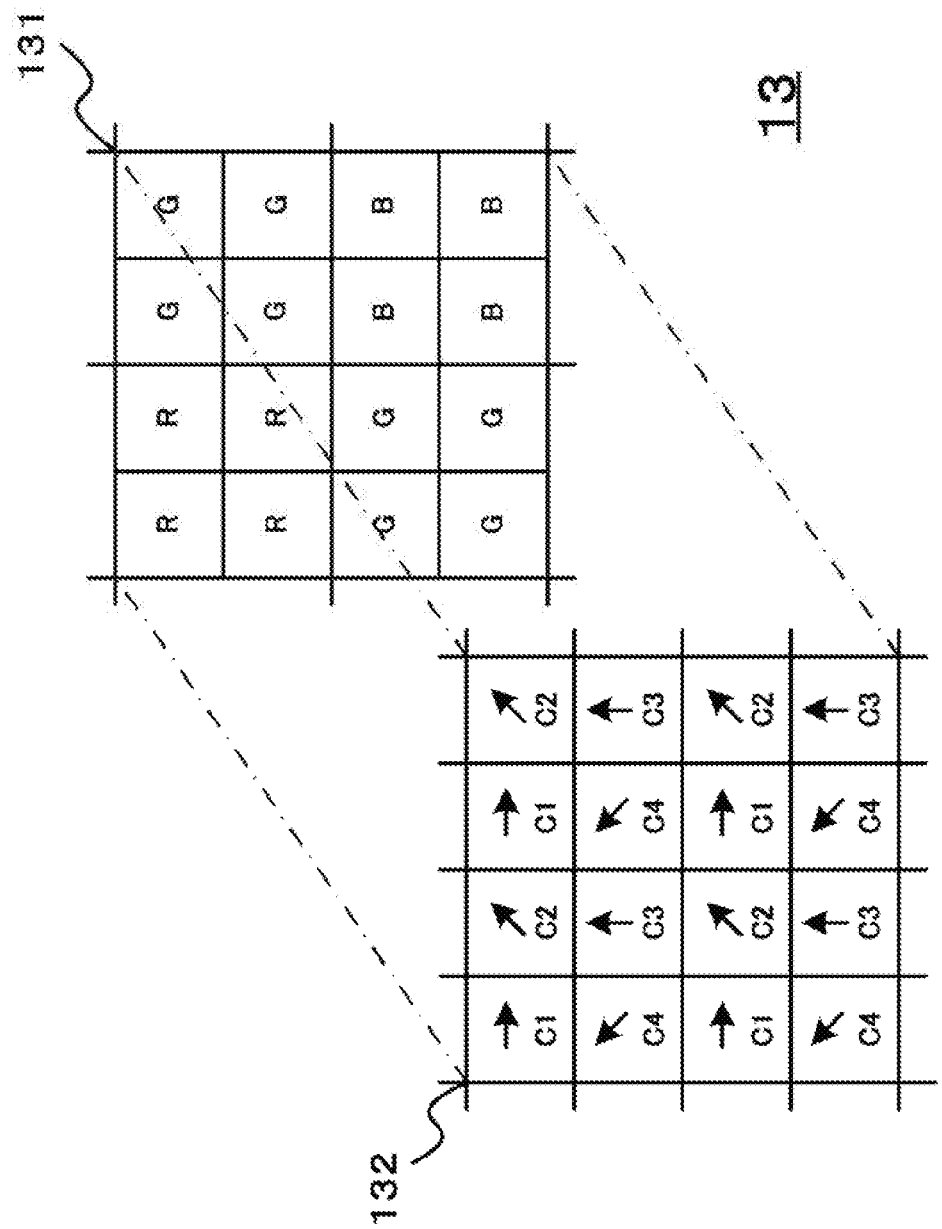
FIG. 11 is a schematic diagram depicting a specific example of the imaging section.
Figure 12:
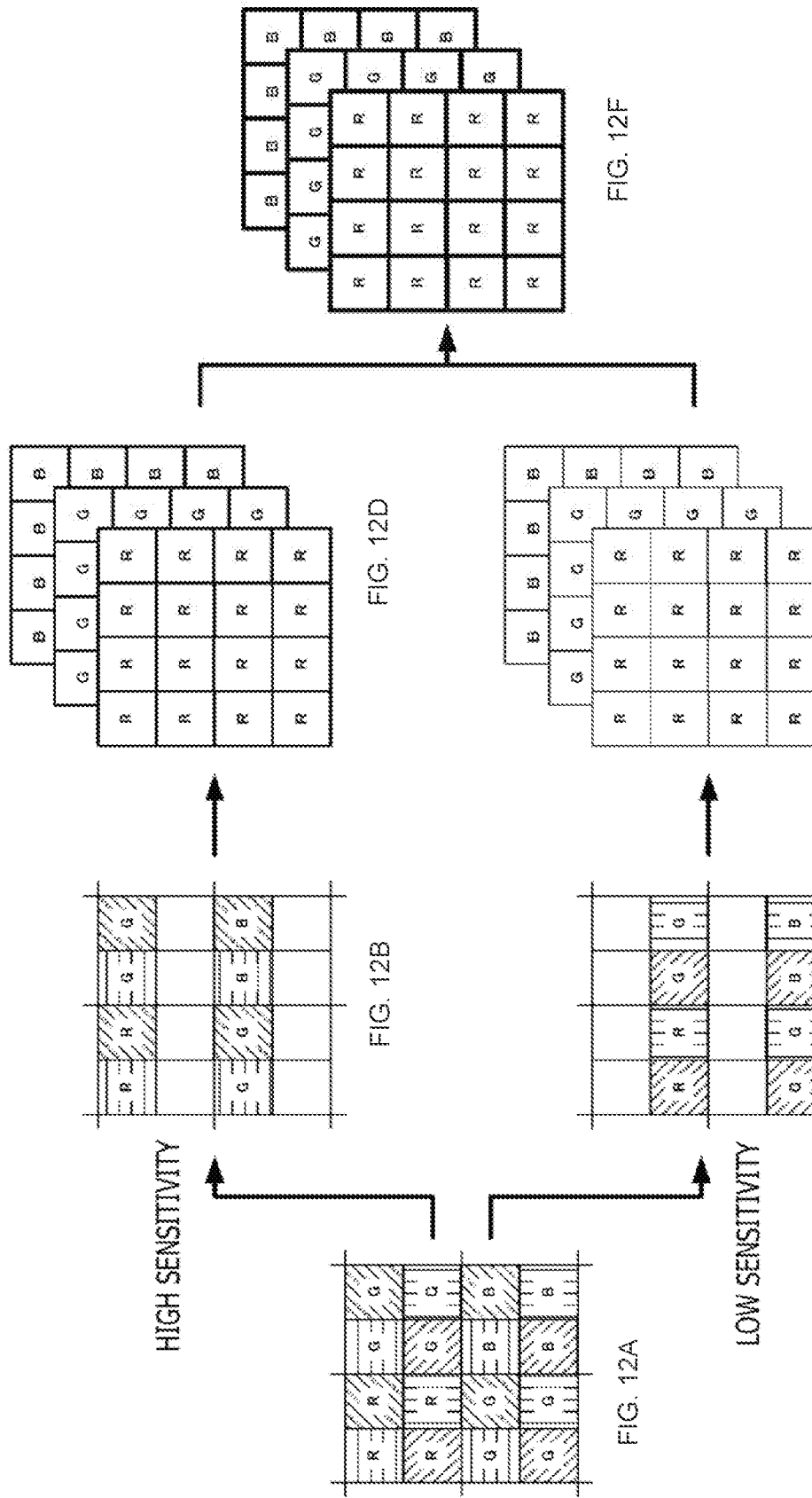
FIGS. 12A, 12B, 12C, 12D, 12E, and 12F is a are set of schematic diagrams depicting typical operations of an image signal processing section.

FIG. 11 depicts a specific example of the imaging section. The imaging section 13 is configured with a mosaic color filter and a polarization filter 132 disposed on the side of the incidence plane of the imaging section, the mosaic filter having a Bayer array of color arrangements with every 2×2 pixels forming a color unit, the polarization filter 132 having pixels in which the 2×2 pixels forming each color unit represent four polarizing directions. In the case where the rotation angle θ of the polarization element 11 is set to 22.5 degrees as described above, the polarization pixels C1 and C2 form high-sensitivity pixels and the polarization pixels C3 and C4 constitute low-sensitivity pixels.

FIGS. 12A, 12B, 12C, 12D, 12E, and 12F depict typical operations of the image signal processing section. The image signal processing section 14 divides the pixels of the imaging section depicted in Subfigure FIG. 12A into a group of high-sensitivity pixels in Subfigure FIG. 12B and a group of low-sensitivity pixels in Subfigure FIG. 12C. Using the pixel signals of the high-sensitivity polarization pixels, the image signal processing section 14 performs pixel interpolation and demosaicing process to generate a high-sensitivity image signal for each color component as illustrated in Subfigure FIG. 12D. Also, using the pixel signals of the low-sensitivity polarization pixels, the image signal processing section 14 performs pixel interpolation and demosaicing process to generate a low-sensitivity image signal for each color component as illustrated in Subfigure FIG. 12E. Further, the image signal processing section 14 discriminates whether the image signal from each pixel of a high-sensitivity image is saturated. In the case where the image signal of the high-sensitivity image is saturated, the image signal processing section 14 performs image composition at a composition ratio in response to incident light (i.e., image signal of the high-sensitivity image) using the image signals from the corresponding pixel positions of a low-sensitivity image amplified with the gain reflecting the sensitivity ratio. The image signal processing section 14 thus generates a wide dynamic range image signal for each color component as depicted in Subfigure FIG. 12F.

Explained above was the operation in the case where the polarization element is attached at the angle of 22.5 degrees. Starting from this angle, the polarization element may be attached at angles reached when rotated in increments of 45 degrees. In this case, although the combination of high- and low-sensitivity pixels varies with the polarization pixels having four polarizing directions, the image signal for each color component of the wide dynamic range image is generated in the same manner described above.

By carrying out the above processing, the imaging apparatus 10 generates the wide dynamic range image without utilizing multiple images with different exposure times. Because captured images with different sensitivity levels can be generated with the same exposure time, it is possible to generate a wide dynamic range image with no motion blur when a dark, moving target object is imaged.

<2-2. Second Imaging Operation in Wide Dynamic Range Imaging Mode>

It was explained above that the first imaging operation involves generating the image signal for each color component of the wide dynamic range image with the polarizing direction of the polarization element 11 set, for example, to 22.5 degrees to use the polarization pixels C1 to C4 as the high- or low-sensitivity pixels. However, the polarizing direction of the polarization element 11 is not limited to the predetermined rotation angle. Alternatively, the polarization element 11 may be configured in such a manner that its polarizing direction may be rotated freely.

Figure 13:
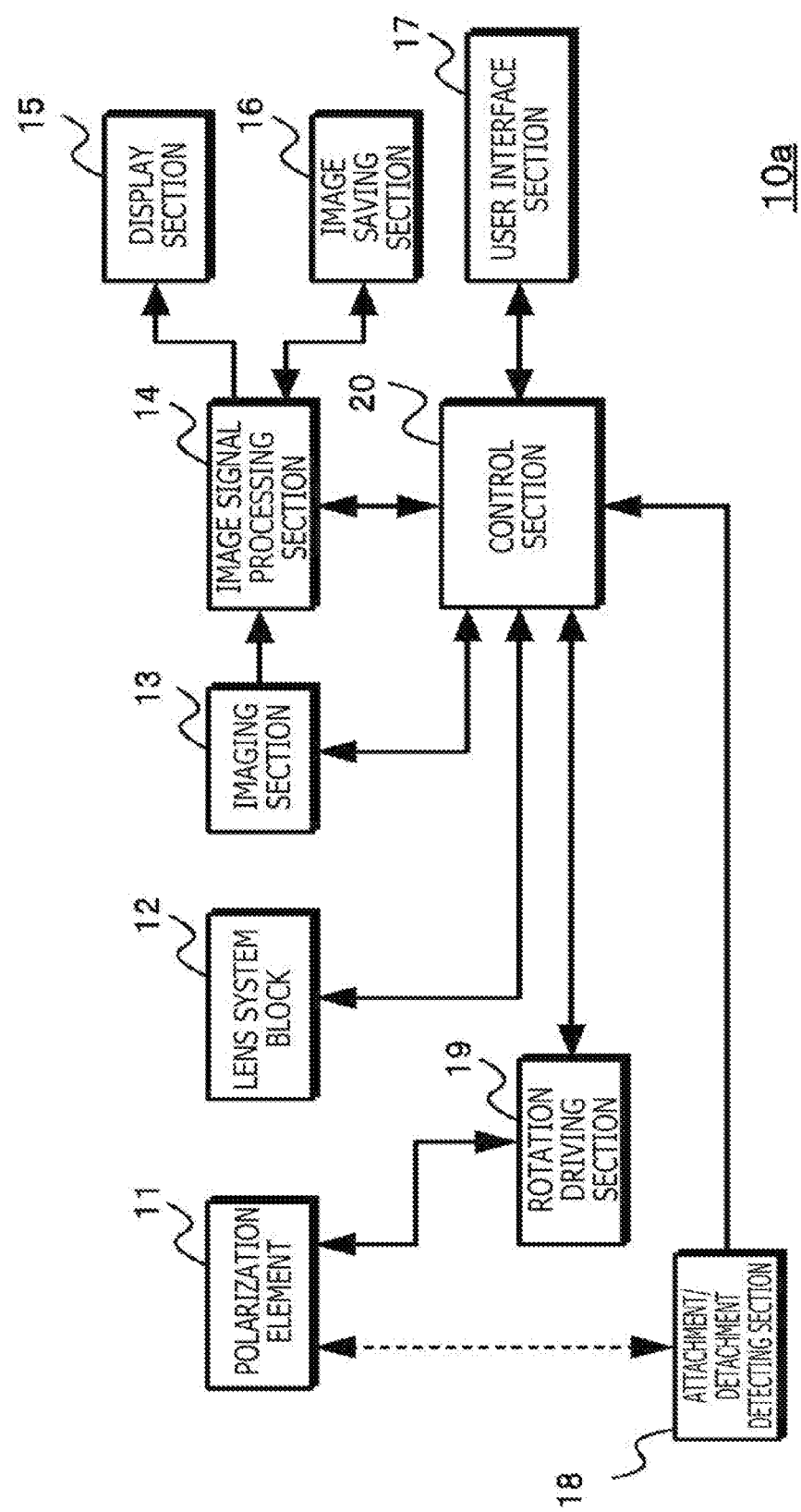
FIG. 13 is a schematic diagram depicting a typical configuration of an imaging apparatus that allows the polarizing direction of the polarization element to be rotated.

FIG. 13 depicts a typical configuration of an imaging apparatus that allows the polarizing direction of the polarization element to be rotated. An imaging apparatus 10a includes a polarization element 11, a lens system block 12, an imaging section 13, an image signal processing section 14, a display section 15, an image saving section 16, a user interface section 17, an attachment/detachment detecting section 18, a rotation driving section 19, and a control section 20.

As explained above with reference to FIG. 1, the polarization element 11 is a polarization element which generates linearly polarized light. The lens system block 12 includes a focus lens, a zoom lens, and a diaphragm mechanism. The imaging section 13 is configured using a polarization filter with pixels having multiple polarizing directions and disposed on the incidence plane of an image sensor so that multiple pixels generating a pixel signal based on incident light represent one of the multiple polarizing directions. The image signal processing section 14 performs various kinds of image processing on the image signal output from the imaging section 13. Also, the image signal processing section 14 performs gain adjustment on the polarization pixels of the imaging section 13 in accordance with their sensitivity levels, and carries out image composition using the gain-adjusted image signals. The display section 15 displays on its screen captured images and various information, among others. The image saving section 16 stores the image data output from the image signal processing section 14 and metadata regarding the image data. The user interface section 17 generates operation signals corresponding to operations performed by the user, and outputs the generated signals to the control section 20. In the case where the polarization element 11 is detachably attached to the imaging apparatus 10, the attachment/detachment detecting section 18 detects whether the polarization element 11 is attached to or detached from the imaging apparatus 10.

The rotation driving section 19 changes the polarizing direction of the linearly polarized light by rotating the polarization element 11 around the optical axis direction of light that is incident on the imaging section 13. The rotation driving section 19 rotates the polarization element 11 on the basis of a drive signal from the control section 20. Also, the rotation driving section 19 generates information indicating the rotational position of the polarization element 11 and outputs the generated information to the control section 20. When the information indicating the rotational position of the polarization element 11 is output to the control section 20 as described, the control section 20 can discriminate the rotational position of the polarization element 11 if, for example, the user performs an operation to rotate the polarization element 11.

The control section 20 includes a CPU (Central Processing Unit), a ROM (Read Only Memory), and a RAM (Random Access Memory). The ROM (Read Only Memory) stores various programs to be executed by the CPU (Central Processing Unit). The RAM (Random Access Memory) stores information such as various parameters. The CPU executes the various programs stored in the ROM and, on the basis of the operation signals from the user interface section 17, controls the components involved in such a manner that the imaging apparatus 10 performs an imaging operation in an operation mode corresponding to the user's operations.

Also, in the case where the control section 20 discriminates that the polarization element 11 is attached to the imaging apparatus 10 on the basis of the detection signal from the attachment/detachment detecting section 18, the control section 20 determines that the imaging mode is wide dynamic range imaging mode. In the case where the control section 20 sets wide dynamic range imaging mode as the imaging mode, the control section 20 detects the sensitivity level in each polarizing direction of the polarization pixels in the imaging section on the basis of the rotational position of the polarization element, for example. Furthermore, the control section 20 notifies the image signal processing section 14 of the detected sensitivity levels so that the image signal processing section 14 will perform gain adjustment and image composition as described above. Also, in the case where the polarization element 11 is detected to be detached from the imaging apparatus 10 on the basis of the detection signal from the attachment/detachment detecting section 18, the control section 20 determines that the imaging mode is polarization imaging mode. Upon determining that polarization imaging mode is in effect, the control section 20 controls the image signal processing section 14 to generate the image signal of the recording image by performing processes except for the gain adjustment corresponding to sensitivity ratio and the pixel signal compositing process following the gain adjustment.

When the polarization element 11 is configured in such a manner that its polarizing direction is freely rotated in the operation discussed above, the dynamic range is made wider than in the first imaging operation.

FIG. 14 depicts, for example, a case where the rotation angle of the polarization element 11 is larger than 0 degrees and smaller than 22.5 degrees. Suppose that when the rotation angle is the angle θ a larger than 0 degrees and smaller than 22.5 degrees, the polarization pixels C1, C2, C3, and C4 have sensitivity levels SE1, SE2, SE3, and SE4, respectively. In this case, the sensitivity levels of the polarization pixels C1 to C4 are in the relation of "SE1>SE2>SE4>SE3." That is, four pixel signals of different sensitivity levels are simultaneously generated. It is assumed that a sensitivity ratio "SE1/SE2" between the polarization pixels C1 with the highest sensitivity level and the polarization pixels C2 with a lower sensitivity level is taken as a gain GA2 with respect to the polarization pixel C2 with the lower sensitivity level. It is also assumed that a sensitivity ratio "SE1/SE3" between the polarization pixels C1 with the highest sensitivity level and the polarization pixels C3 with another lower sensitivity level is taken as a gain GA3 with respect to the polarization pixel C3 with the lower sensitivity level. It is further assumed that a sensitivity ratio "SE1/SE4" between the polarization pixels C1 with the highest sensitivity level and the polarization pixels C4 with another lower sensitivity level is taken as a gain GA4 with respect to the polarization pixel C4 with the lower sensitivity level.

The image signal processing section 14 performs gain adjustment using the gains set by the control section 20, and carries out image composition following the gain adjustment. FIGS. 15A and 15B are another set of schematic diagrams explaining gain adjustment and image composition. Subfigure FIG. 15A depicts signal intensity levels of polarization pixels with regard to incident light. For example, the polarization pixels C1 are saturated at a signal intensity level IMsat in the case where the incident light has a luminance level LRp1. The polarization pixels C2 are saturated at the signal intensity level IMsat in the case where the incident light has a luminance level LRp2 higher than the luminance level LRp1. The polarization pixels C4 are saturated at the signal intensity level IMsat in the case where the incident light has a luminance level LRp4 higher than the luminance level LRp2. The polarization pixels C3 are saturated at the signal intensity level IMsat in the case where the incident light has a luminance level LRp3 higher than the luminance level LRp4. In such cases, as illustrated in Subfigure FIG. 15B, the image signal processing section 14 amplifies the pixel signal of the polarization pixels C2 by the gain GA2 corresponding to their sensitivity level, amplifies the pixel signal of the polarization pixels C4 by the gain GA4 corresponding to their sensitivity level, and amplifies the pixel signal of the polarization pixels C3 by the gain GA3 corresponding to their sensitivity level. Thereafter, the image signal processing section 14 performs image composition so as to generate a wide dynamic range image signal in which saturation does not occur even if the incident light exceeds the luminance level LRp1, LRp2, or LRp4.

In the above processing, the image signal of the captured image with a still wider dynamic range is generated than in the first imaging operation. Because the polarization element 11 is rotatable, it is possible to adjust a reflection component that emanates, for example, from the surface of water or from the windowpane by rotating the polarization element 11. This makes it possible to verify the effects of the adjustment on the basis of a through-image and to generate the image signal of the captured image with the wide dynamic range. If the sensitivity levels of the different polarization pixels at different rotational angles of the polarization element 11 are calculated and stored beforehand, rotating the polarization element 11 automatically permits gain adjustment that reflects the rotational position of the polarization element 11.

3. OTHER CONFIGURATIONS OF THE IMAGING APPARATUS

Figure 16C:
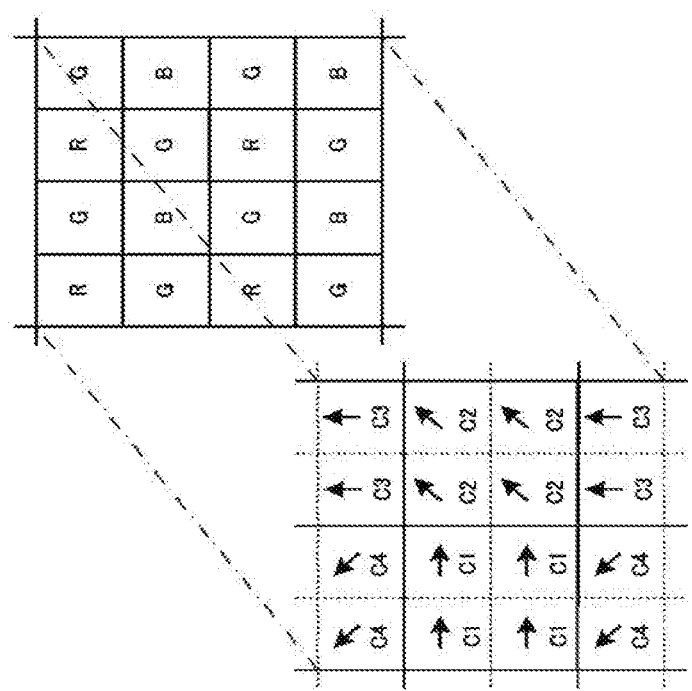
FIGS. 16A, 16B, and 16C are schematic diagrams depicting another typical configuration of the imaging section.
Figure 16B:
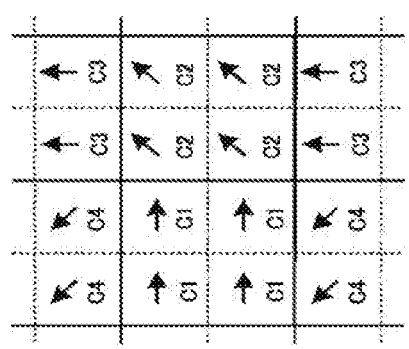
Figure 16A:
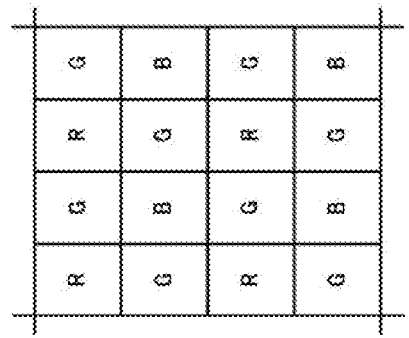

The configuration of the imaging section is not limited to the ones where the polarization element has each of its pixels provided with a different polarization angle, as depicted in FIGS. 2 and 11. Alternatively, the imaging section may be configured to have units of multiple pixels each furnished with a different polarization angle. FIGS. 16A, 16B, and 16C depict another typical configuration of the imaging section. Subfigure FIG. 16A depicts a typical color pattern and Subfigure FIG. 16B illustrates a typical polarization pattern. This color pattern has a Bayer array of color arrangements with every pixel forming a color unit. The polarization pattern has every 2×2 pixels forming a polarization component unit, the 2×2 polarization component unit being repeatedly disposed to provide four different polarizing directions. The color pattern and the polarization pattern are combined in such a manner as to provide four polarization components per color component. Subfigure FIG. 16C depicts a typical combination of a color mosaic filter and a polarization filter. In this combination, each polarization component unit includes the pixels of each color component, so that four polarization components are available with each color component. Furthermore, the color component unit, formed with the 1×1 pixel configuration, has a less biased arrangement of the color component pixels than with the 2×2 pixel configuration. This provides better image quality than in the case of the combination depicted in FIG. 11.

Further, the imaging section 13 may be configured with polarized images in two different polarizing directions. FIGS. 17A and 17B depict a case where polarization pixels have two polarizing directions. Subfigure FIG. 17A illustrates a typical polarization pattern of a polarized image. This is an example in which the imaging section is constituted by the polarization pixels C1 and C3. In this case, the relations between rotation angle and sensitivity are as depicted in Subfigure FIG. 17B, from which the characteristics of the polarization pixels C2 and C4 in FIG. 8 are excluded. For example, in a case where the rotation angle θ of the polarization element 11 is 45 degrees, there is no difference in sensitivity between the polarization pixels C1 and C3. Thus the attachment angle of the polarization element 11 with respect to the imaging section 13 is set in such a manner that the rotation angle θ of the polarization element 11 is 22.5 degrees, for example. In this case, the polarization pixels C1 have high sensitivity while the polarization pixel C3 have a sensitivity level lower than that of the polarization pixels C1, so that pixel signals of different sensitivity levels are simultaneously generated.

4. APPLICATION EXAMPLES

The technology of the present disclosure may be applied to diverse products. For example, the technology may be implemented as an apparatus to be attached not only on information processing terminals but also on such mobile objects as automobiles, electric vehicles, hybrid electric vehicles, motorcycles, bicycles, personal mobility devices, aircraft, drones, ships, robots, construction equipment, and agricultural machinery (tractors).

Figure 18:
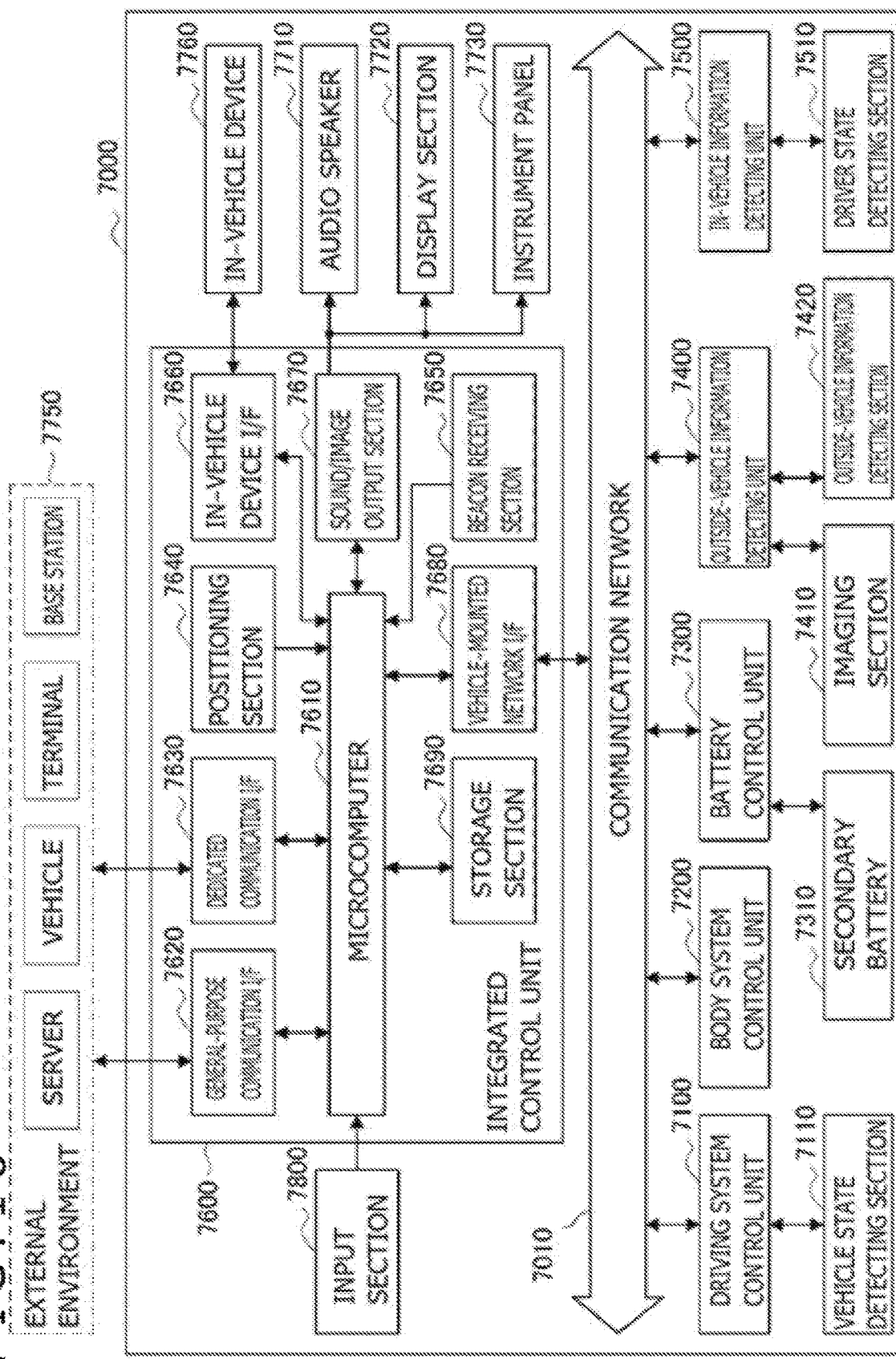
FIG. 18 is a block diagram depicting an example of schematic configuration of a vehicle control system.

FIG. 18 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 18, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 18 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 19:
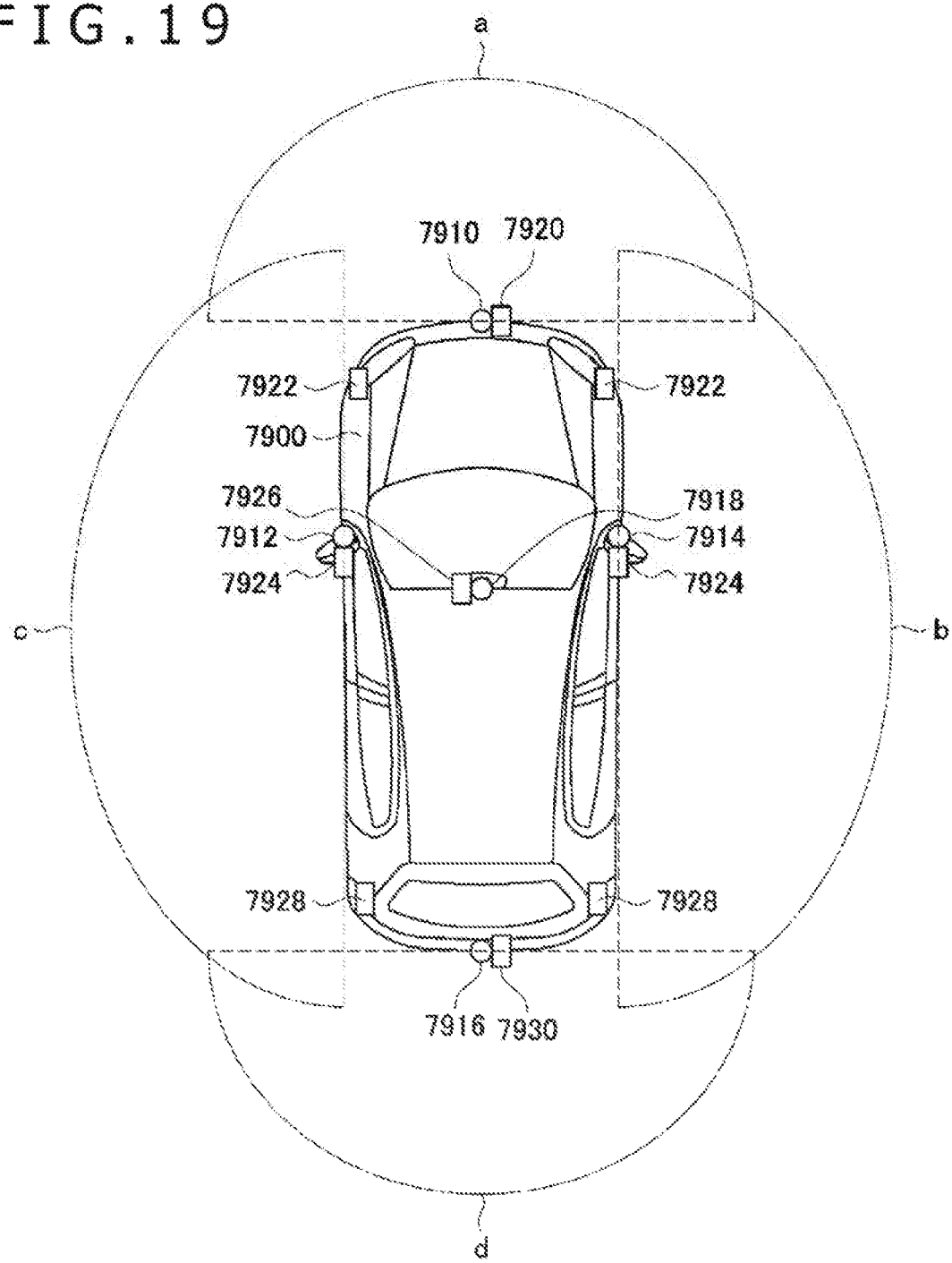
FIG. 19 is a diagram of assistance in explaining an example of installation positions of an outside-vehicle information detecting section and an imaging section.

FIG. 19 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 19 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 18, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM), worldwide interoperability for microwave access (WiMAX), long term evolution (LTE), LTE-advanced (LTE-A), or the like, or another wireless communication protocol such as wireless LAN (referred to also as wireless fidelity (Wi-Fi; registered trademark), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth, near field communication (NFC), or wireless universal serial bus (WUSB). In addition, the in-vehicle device I/F 7660 may establish wired connection by universal serial bus (USB), high-definition multimedia interface (HDMI), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 18, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 18 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

In the vehicle control system 7000 discussed above, the imaging section depicted in FIG. 1 is to be used as one or all of the imaging sections 7410, 7910, 7912, 7914, 7916 and 7918, the imaging section being furnished with the polarization element. Also, the image signal processing section 14 and the control section 20 are to be included in the integrated control unit 7600 as part of the application example illustrated in FIG. 18. This configuration permits acquisition of the captured image with a wide dynamic range. The wide dynamic range image thus captured and acquired is used to support or control vehicle driving, for example.

The series of the processes described above may be executed by hardware, by software, or by the combination of both. In a case where the software-based processing is to be carried out, the programs constituting process sequences may be installed into an internal memory of a computer in dedicated hardware for program execution. Alternatively, the programs may be installed into a general-purpose computer capable of performing diverse processes for execution of the programs.

For example, the programs may be stored (recorded) beforehand on such recording media as a hard disc, a SSD (Solid State Drive), and a ROM (Read Only Memory). Alternatively, the programs may be recorded temporarily or permanently on removable recording media including flexible discs, CD-ROM (Compact Disc Read Only Memory), MO (Magneto Optical) discs, DVDs (Digital Versatile Discs), BDs (Blu-Ray Discs; registered trademark), magnetic discs, and semiconductor memory cards. Such removable recording media may be offered as so-called packaged software.

Besides being installed from the removable recording media into the computer, the programs may be transferred in wired or wireless fashion to the computer from a download site via networks such as LAN (Local Area Network) and the Internet. The computer may receive the transferred programs and install the received programs onto an internal recording medium such as an internal hard disc.

The advantageous effects stated in this description are only examples and are not limitative of the present technology. There may be additional advantageous effects derived from and not covered by this description. The present technology, when interpreted, should not be limited to the embodiments discussed above. The technology is disclosed using examples and illustrations. It is thus evident that many alternatives, modifications and variations of the embodiments will become apparent to those skilled in the art without departing from the spirit and scope of this technology. Accordingly, the scope of the present technology should be determined by the appended claims and their legal equivalents, rather than by the examples given.

The image processing apparatus according to the present technology may be configured preferably as follows:

(1)

An imaging apparatus including:

an imaging section configured to let multiple pixels generating a pixel signal based on incident light act as polarization pixels each having one of multiple polarizing directions; and a polarization element configured to be attached on a side of an incidence plane of the imaging section.

(2)

The imaging apparatus as stated in paragraph (1) above, further including:

a sensitivity detecting section configured to detect a sensitivity level of the polarization pixels in each of the polarizing directions in the imaging section; and an image signal processing section configured to perform gain adjustment on the polarization pixels on the basis of the sensitivity levels detected by the sensitivity detecting section, the image signal processing section further performing image composition using the gain-adjusted image signals.

(3)

The imaging apparatus as stated in paragraph (2) above, in which the image signal processing section generates the image signal of a captured image at each of sensitivity levels using the polarization pixels having the same sensitivity level, the image signal processing section further performs gain adjustment on the image signal of the captured image at each of the sensitivity levels on the basis of the sensitivity levels detected by the sensitivity detecting section, the image signal processing section further performs image composition of the captured images at each of the sensitivity levels using the gain-adjusted image signals.

(4)

The imaging apparatus as stated in paragraph (3) above, in which, in a case where some of the polarization pixels are saturated during the image composition, the image signal processing section performs switchover from the image signal of the captured image generated by use of the saturated polarization pixels to the image signal of the captured image generated by use of the polarization pixels having a sensitivity level lower than that of the saturated polarization pixels.

(5)

The imaging apparatus as stated in paragraph (4) above, in which the image signal processing section controls, in response to the incident light, a composition ratio between the image signal of the captured image generated by use of the saturated polarization pixels and the image signal of the captured image generated by use of the polarization pixels having the lower sensitivity level, thereby performs switchover from the image signal of the captured image generated by use of the saturated polarization pixels to the image signal of the captured image generated by use of the polarization pixels having the lower sensitivity level.

(6)

The imaging apparatus as stated in any one of paragraphs (2) to (5) above, in which the sensitivity detecting section detects the sensitivity level in each of the polarizing directions on the basis of the attachment angle of the polarization element.

(7)

The imaging apparatus as stated in any one of paragraphs (2) to (5) above, in which the sensitivity detecting section detects the sensitivity level in each of the polarizing directions on a basis of pixel signals generated by the polarization pixels having the polarizing directions different from each other.

(8)

The imaging apparatus as stated in any one of paragraphs (2) to (7) above, in which, in a case where the polarization element is attached, the image signal processing section performs the gain adjustment and the image composition.

(9)

The imaging apparatus as stated in any one of paragraphs (1) to (8) above, in which the attachment angle of the polarization element with respect to the imaging section is set in such a manner as to produce a difference in sensitivity between the polarization pixels having the polarizing directions different from each other in the imaging section.

(10)

The imaging apparatus as stated in any one of paragraphs (1) to (9) above, in which the polarization element is configured to be rotatable around an optical axis direction of the incident light entering the imaging section.

(11)

The imaging apparatus as stated in any one of paragraphs (1) to (10) above, in which the polarization element generates linearly polarized light.

INDUSTRIAL APPLICABILITY

According to the imaging apparatus and the imaging method of the present technology, incident light enters via a polarization element an imaging section furnished with multiple pixels which generate a pixel signal based on the incident light and which constitute polarization pixels each having one of multiple polarizing directions. The polarization pixels are each provided with a sensitivity level corresponding to the polarizing direction of the incident light, permitting the capture of a wide dynamic range image. Gain adjustment is performed on the basis of the sensitivity levels of the polarization pixels, and image composition is carried out using the gain-adjusted image signals to generate a captured image having wide dynamic range with minimum motion blur. The present technology is thus suitable for use in devices that perform various controls based on the captured image having wide dynamic range with minimum motion blur.

REFERENCE SIGNS LIST 10, 10a . . . Imaging apparatus
11 . . . Polarization element
12 . . . Lens system block
13 . . . Imaging section
14 . . . Image signal processing section
15 . . . Display section
16 . . . Image saving section
17 . . . User interface section
18 . . . Attachment/detachment detecting section
19 . . . Rotation driving section
20 . . . Control section
131 . . . Image sensor
132 . . . Polarization filter

The invention claimed is:

1. An imaging apparatus, comprising:
an imaging sensor that includes a plurality of pixels configured to generate a pixel signal based on incident light;
a plurality of polarization pixels configured to generate a plurality of image signals, wherein each of the plurality of polarization pixels has one of a plurality of polarizing directions; and
circuitry configured to:
detect a polarization element, detachably attached to the imaging apparatus, is attached to the imaging apparatus; and
execute image composition based on
the detection that the polarization element is attached to the imaging apparatus, and
the plurality of image signals of which polarizing directions have different sensitivities.

2. The imaging apparatus according to claim 1, wherein the circuitry is further configured to:
detect sensitivity levels of the plurality of polarization pixels in the plurality of polarizing directions based on an attachment angle of the polarization element;
execute gain adjustment on the plurality of image signals of the plurality of polarization pixels based on the detected sensitivity levels, to obtain gain-adjusted image signals; and
execute the image composition based on the gain-adjusted image signals.

3. The imaging apparatus according to claim 2, wherein the circuitry is further configured to:
generate an image signal at each of specific sensitivity levels based on the plurality of polarization pixels having the same sensitivity level;
execute the gain adjustment on the image signal at each of the specific sensitivity levels based on the detected sensitivity levels, to obtain a gain-adjusted image signal; and
execute the image composition based on the gain-adjusted image signal.

4. The imaging apparatus according to claim 3, wherein the circuitry is further configured to:
determine at least one of the plurality of polarization pixels is saturated during the image composition; and
execute, based on the determination, switchover from the image signal generated based on saturated polarization pixels to an image signal generated based on the plurality of polarization pixels having a sensitivity level lower than that of the saturated polarization pixels.

5. The imaging apparatus according to claim 4, wherein the circuitry is further configured to:
control, in response to the incident light, a composition ratio between the image signal generated based on the saturated polarization pixels and the image signal generated based on the plurality of polarization pixels having the sensitivity level lower than that of the saturated polarization pixels; and
execute, based on the composition ratio, the switchover from the image signal generated based on the saturated polarization pixels to the image signal generated based on the plurality of polarization pixels having the sensitivity level lower than that of the saturated polarization pixels.

6. The imaging apparatus according to claim 2, wherein the circuitry is further configured to detect the sensitivity levels in the plurality of polarizing directions based on pixel signals generated by the plurality of polarization pixels having different polarizing directions.

7. The imaging apparatus according to claim 2, wherein the circuitry is further configured to execute, based on the detection that the polarization element is attached, the gain adjustment and the image composition.

8. The imaging apparatus according to claim 1, wherein an attachment angle of the polarization element with respect to the imaging sensor is set in such a manner as to produce a difference in sensitivity between the plurality of polarization pixels having different polarizing directions in the imaging sensor.

9. The imaging apparatus according to claim 1, wherein the polarization element is configured to be rotatable around an optical axis direction of the incident light that enters the imaging sensor.

10. The imaging apparatus according to claim 1, wherein the polarization element is configured to generate linearly polarized light.

11. An imaging method, comprising:
in an imaging apparatus that includes an imaging sensor, a plurality of polarization pixels, and circuitry, wherein the imaging sensor includes a plurality of pixels configured to generate a pixel signal based on incident light, and each of the plurality of polarization pixels has one of a plurality of polarizing directions:
detecting, by the circuitry, a sensitivity level of the plurality of polarization pixels in each of the plurality of polarizing directions at a time the incident light enters the imaging sensor via a polarization element, wherein the detection of the sensitivity level is based on an attachment angle of the polarization element;
executing, by the circuitry, gain adjustment on image signals of the plurality of polarization pixels based on sensitivity levels detected by the circuitry, to obtain gain-adjusted image signals; and
executing image composition by the circuitry based on the gain-adjusted image signals.

12. An imaging apparatus, comprising:
an imaging sensor that includes a plurality of pixels configured to generate a pixel signal based on incident light;
a plurality of polarization pixels, wherein each of the plurality of polarization pixels has one of a plurality of polarizing directions; and
circuitry configured to:
detect a sensitivity level of the plurality of polarization pixels in each of the plurality of polarizing directions in the imaging sensor,
wherein the detection of the sensitivity level of the plurality of polarization pixels in each of the plurality of polarizing directions is based on an attachment angle of a polarization element detachably attached to the imaging apparatus;
execute gain adjustment on image signals of the plurality of polarization pixels based on sensitivity levels detected by the circuitry,
to obtain gain-adjusted image signals; and
execute image composition based on the gain-adjusted image signals.

13. An imaging apparatus, comprising:
an imaging sensor that includes a plurality of pixels configured to generate a pixel signal based on incident light;
a plurality of polarization pixels configured to generate a plurality of image signals, wherein each of the plurality of polarization pixels has one of a plurality of polarizing directions; and
circuitry configured to:
detect a change of a relation between a polarizing direction of at least one polarization pixel of the plurality of polarization pixels and a polarizing direction of a polarization element attached to the imaging apparatus; and
execute image composition based on
the detection of the change of the relation between the polarizing direction of the at least one polarization pixel and the polarizing direction of the polarization element, and
the plurality of image signals of which polarizing directions have different sensitivities.

* * * * *